(12) United States Patent
Ozaki

(10) Patent No.: US 7,660,103 B2
(45) Date of Patent: Feb. 9, 2010

(54) ELECTRONIC DEVICE AND ELECTRONIC SYSTEM

(75) Inventor: Yukisuke Ozaki, Kobe (JP)

(73) Assignee: Fujitsu Ten Limited, Kobe (JP)

( * ) Notice: Subject to any disclaimer, the term of this patent is extended or adjusted under 35 U.S.C. 154(b) by 22 days.

(21) Appl. No.: 12/010,387

(22) Filed: Jan. 24, 2008

(65) Prior Publication Data

US 2008/0180889 A1    Jul. 31, 2008

(30) Foreign Application Priority Data

Jan. 29, 2007    (JP) .............................. 2007-018591

(51) Int. Cl.
  *H05K 7/14* (2006.01)
(52) U.S. Cl. ........................... 361/679.02; 361/679.01; 248/917
(58) Field of Classification Search ............ 361/679.21, 361/679.01, 679.02; 248/917
  See application file for complete search history.

(56) References Cited

U.S. PATENT DOCUMENTS

| | | | |
|---|---|---|---|
| 5,610,376 A * | 3/1997 | Takagi et al. ............. 200/50.01 |
| 5,726,868 A * | 3/1998 | Koyama et al. ............. 361/832 |
| 5,917,435 A | 6/1999 | Kamiya et al. |
| 6,563,421 B1 * | 5/2003 | Wheeler ................. 340/539.14 |
| 6,681,176 B2 | 1/2004 | Funk et al. |
| 6,809,920 B2 * | 10/2004 | Muroga et al. ......... 361/679.21 |
| 6,816,783 B2 | 11/2004 | Hashima et al. |
| 7,119,790 B2 * | 10/2006 | Tadokoro et al. ............. 345/156 |
| 2005/0071051 A1 * | 3/2005 | Leung ............................ 701/1 |
| 2006/0104016 A1 * | 5/2006 | Jang et al. .................... 361/681 |

FOREIGN PATENT DOCUMENTS

| | | |
|---|---|---|
| JP | A 8-318792 | 12/1996 |
| JP | A 2001-239895 | 9/2001 |
| JP | A 2002-328026 | 11/2002 |
| JP | A 2003-166848 | 6/2003 |
| JP | A 2005-524570 | 8/2005 |

* cited by examiner

Primary Examiner—Jayprakash N Gandhi
Assistant Examiner—Ingrid Wright
(74) Attorney, Agent, or Firm—Oliff & Berridge, PLC

(57) ABSTRACT

An electronic device includes: a main unit; a cap unit that is capable of having a portable electronic device attached thereto; an instructing unit that issues an instruction to designate a tilt angle of the cap unit with respect to the main unit; a driving unit that drives the cap unit in accordance with the instruction from the instructing unit; and a controlling unit that controls the operation of the driving unit in accordance with the instruction from the instructing unit, when the portable electronic device is not attached to the cap unit.

8 Claims, 19 Drawing Sheets

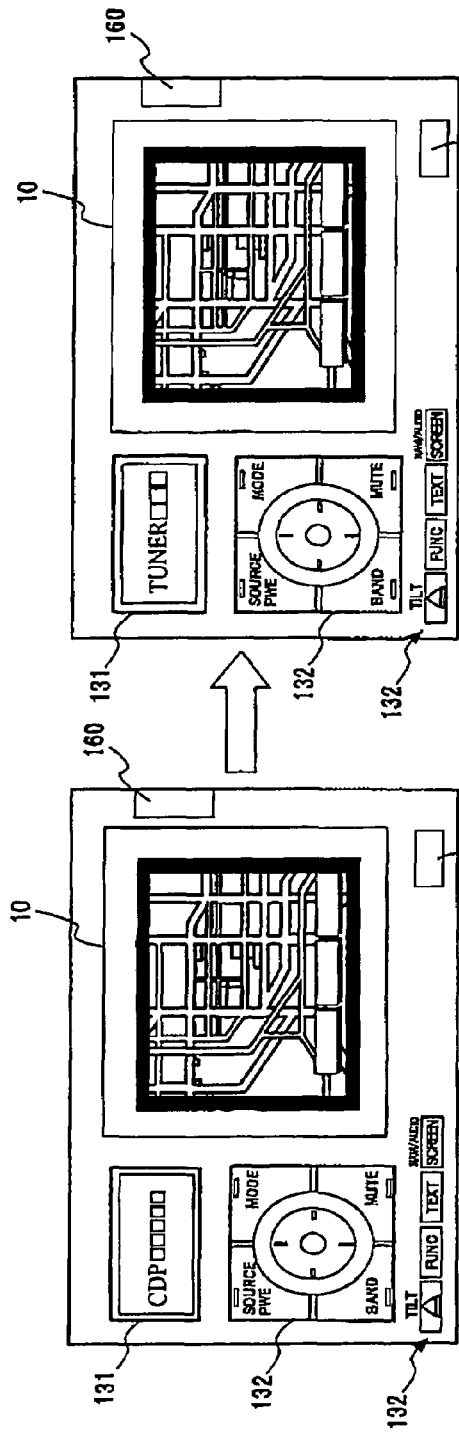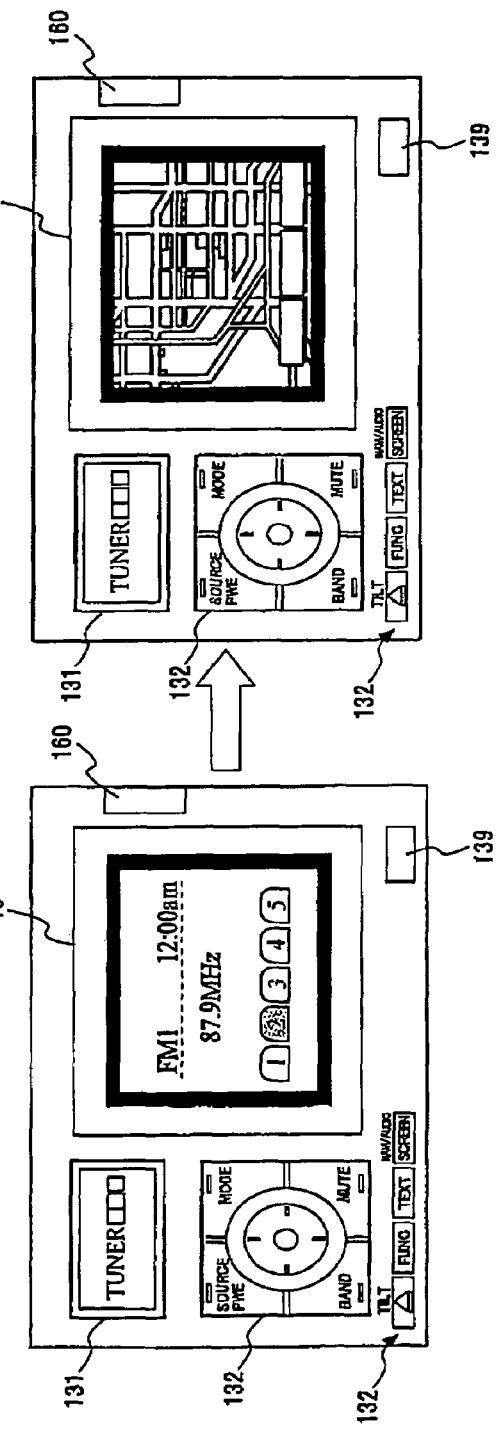

| NUMBER OF PRESSING TIMES | ANGLE θ | NUMBER OF PULSES |
|---|---|---|
| 0 (REFERENCE POSITION) | 0° | 0 |
| 1 | 5° | 10 |
| 2 | 10° | 20 |
| 3 | 15° | 30 |
| 4 | 20° | 40 |
| 5 | 25° | 50 |
| 6 | 30° | 60 |

| | TILT ANGLE | NUMBER OF PULSES |
|---|---|---|
| OPEN STATE | 60° | 120 |

| TILT ANGLE | OPEN/CLOSED STATE |
|---|---|
| θ | OPEN STATE OR CLOSED STATE |

FIG. 14

| TILT ANGLE AT THE TIME OF ATTACHMENT | TILT ANGLE AT THE TIME OF DETACHMENT | OPEN/CLOSED STATE |
|---|---|---|
| $\theta_1$ | $\theta_2$ | OPEN STATE OR CLOSED STATE |

ELECTRONIC DEVICE AND ELECTRONIC SYSTEM

BACKGROUND OF THE INVENTION

1. Field of the Invention

The present invention generally relates to an electronic device, and an electronic system that includes a detachable, portable electronic device and the electronic device.

2. Description of the Related Art

Widely known conventional navigation devices include small-sized portable navigation devices that are called personal navigation devices and can be carried around though their structures are simple, and vehicle-mounted navigation devices that are accommodated and secured in the concave portions (DIN openings) formed in the dashboards of vehicles. Each of the vehicle-mounted navigation devices can perform a highly precise guiding operation, with the assistance of information such as vehicle speed information supplied from the vehicle. Some of the newly suggested vehicle-mounted navigation devices are equipped with audio devices.

In recent years, navigation devices that have the portability of the portable navigation devices and the highly sophisticated guiding performance of the vehicle-mounted navigation systems have been developed.

Japanese Unexamined Patent Publication No. 8-318792 (Reference 1), Japanese Unexamined Patent Publication No. 2002-328026 (Reference 2), Published Japanese Translation No. 2005-524570 of the PCT international publication for a patent application (Reference 3), and Japanese Unexamined Patent Publication No. 2001-239895 (Reference 4) disclose structures each having a navigating unit that can be detached from a vehicle-mounted device mounted on a vehicle. Detached from the vehicle-mounted device, the navigating unit can be used as an independent portable navigation device.

Japanese Unexamined Patent Publication No. 2003-166848 (Reference 5) discloses a structure in which a navigation device can be detached from a vehicle, and can be used while the user is walking. While the navigation device is mounted in the vehicle, the navigation device operates in a car navigating mode. When detached from the vehicle, the navigation device operates in a human navigating mode.

However, any of References 1 through 5 neither discloses nor suggests a structure in which a vehicle-mounted device to which a navigating unit is to be attached has a cap unit that can tilt with respect to the vehicle-mounted device main unit.

FIG. 17 shows a conventional structure in which a front-face unit (cap unit) 802 of a vehicle-mounted device 801 to which a navigating unit 804 is to be attached is pushed forward by a slider 803 and tilts with respect to the vehicle-mounted device main unit. When the navigating unit B04 is attached to the front-face unit 802 of the vehicle-mounted device in a tilting state, excess load is put on the slider 803, and the slider 803 might be damaged. Therefore, it is necessary to prevent damage to the slider 803. Also, when the front-face unit 120 is not in a tilting state, the CD insertion/ejection slit is not exposed, and a CD cannot be inserted or ejected.

In the structure in which the front-face unit (the cap unit) 802 of the vehicle-mounted device 801 to which the navigating unit 804 is to be attached is pushed forward by the slider 803 and tilts with respect to the vehicle-mounted device main unit as shown in FIG. 17, the tilt angle of the front-face unit 802 can be adjusted by a user with the use of an operating unit (not shown), regardless of the connecting state of the navigating unit 804.

Accordingly, even if a user adjusts the tilt angle of the front-face unit 802 so as to increase the visibility of the navigating unit 804 while the navigating unit 804 is attached to the front-face unit 802, the user needs to readjust the tilt angle of the front-face unit 802 when the navigating unit 804 is put back to the front-face unit 802 after the tilt angle of the front-face unit 802 is automatically adjusted while the navigating unit 804 is detached from the front-face unit 802.

Meanwhile, there has been a demand for an increase in the visibility of the navigating unit 804 by making the tilt angle of the front-face unit 802 of the vehicle-mounted device 801 adjustable while the navigating unit 804 is attached to the front-face unit 802 of the vehicle-mounted device 801.

There has also been the problem that, even if a user adjusts the tilt angle of the front-face unit 802 so as to increase the operability of the vehicle-mounted device 801 while the navigating unit 804 is detached from the front-face unit 802, the user needs to readjust the tilt angle of the front-face unit 802 when the navigating unit 804 is detached from the front-face unit 802 after the tilt angle of the front-face unit 802 is automatically adjusted while the navigating unit 804 is attached to the front-face unit 802.

SUMMARY OF THE INVENTION

It is therefore an object of the present invention to provide an electronic device and an electronic system in which the above disadvantages are eliminated.

A more specific object of the present invention is to provide an electronic device and an electronic system that can restrict a tilting action of the cap unit in accordance with whether a portable electronic device is attached to the cap unit, or can cause the cap unit to tilt in accordance with a change in the connecting state of the portable electronic device.

According to an aspect of the present invention, there is provided an electronic device including: a main unit; a cap unit that is capable of having a portable electronic device attached thereto; an instructing unit that issues an instruction to designate a tilt angle of the cap unit with respect to the main unit; a driving unit that drives the cap unit in accordance with the instruction from the instructing unit; and a controlling unit that controls the operation of the driving unit in accordance with the instruction from the instructing unit, when the portable electronic device is not attached to the cap unit.

According to another aspect of the present invention, there is provided an electronic system including: a portable electronic device; and an electronic device that is capable of having the portable electronic device attached thereto, the electronic device including: a main unit; a cap unit that is capable of having a portable electronic device attached thereto; an instructing unit that issues an instruction to designate a tilt angle of the cap unit with respect to the main unit; a driving unit that drives the cap unit in accordance with the instruction from the instructing unit; and a controlling unit that controls the operation of the driving unit in accordance with the instruction from the instructing unit, when the portable electronic device is not attached to the cap unit.

With the above structures, the tilting action of the cap unit can be changed in accordance with whether the portable electronic device is attached to the cap unit. Accordingly, while the portable electronic device is not attached to the cap unit, the tilting action of the cap unit in accordance with the instruction from the instructing unit is restricted. Thus, there is no need to readjust the tilt angle of the cap unit when the portable electronic device is attached to the cap unit.

According to a further aspect of the present invention, there is provided an electronic device including: a main unit; a cap unit that is capable of having a portable electronic device attached thereto; an instructing unit that issues an instruction to designate a tilt angle of the cap unit with respect to the main unit; a driving unit that drives the cap unit in accordance with the instruction from the instructing unit; a memory unit that stores tilt angle information about a tilt angle of the cap unit observed before the portable electronic device is detached from the cap unit, or tilt angle information about a tilt angle of the cap unit observed before the portable electronic device is attached to the cap unit; and a controlling unit that controls the driving unit, based on a change in a connecting state of the portable electronic device and the tilt angle information that is stored in the memory unit.

According to a still further aspect of the present invention, there is provided an electronic system including: a portable electronic device; and an electronic device that is capable of having the portable electronic device attached thereto, the electronic device including: a main unit; a cap unit that is capable of having a portable electronic device attached thereto; an instructing unit that issues an instruction to designate a tilt angle of the cap unit with respect to the main unit; a driving unit that drives the cap unit in accordance with the instruction from the instructing unit; a memory unit that stores tilt angle information about a tilt angle of the cap unit observed before the portable electronic device is detached from the cap unit, or tilt angle information about a tilt angle of the cap unit observed before the portable electronic device is attached to the cap unit; and a controlling unit that controls the driving unit, based on a change in a connecting state of the portable electronic device and the tilt angle information that is stored in the memory unit.

With the above structures, the cap unit can tilt in accordance with a change in the connecting state of the portable electronic device. Accordingly, when the portable electronic device is attached to the cap unit, the tilt angle of the cap unit can be adjusted to the tilt angle that is observed before the portable electronic device is detached from the cap unit. When the portable electronic device is detached from the cap unit, the tilt angle of the cap unit can be adjusted to the tilt angle that is observed before the portable electronic device is attached to the cap unit.

In accordance with the present invention, the tilting action of the cap unit can be restricted in accordance with whether a portable electronic device is attached to the cap unit, or the cap unit can tilt in accordance with a change in the connecting state of the portable electronic device.

BRIEF DESCRIPTION OF THE DRAWINGS

Other objects, features and advantages of the present invention will become more apparent from the following detailed description when read in conjunction with the accompanying drawings, in which:

FIGS. 7A through 7D show the changes of the contents displayed on the display unit of the vehicle-mounted device and the display unit of the portable device;

FIG. 14 shows an example of table information that is stored in the memory of a vehicle-mounted device in accordance with a second embodiment of the present invention;

DESCRIPTION OF THE PREFERRED EMBODIMENTS

The following is a description of preferred embodiments of the present invention, with reference to the accompanying drawings. It should be noted that the scope of the present invention is not limited to the embodiments described below, and is defined in the claims and their equivalents.

Embodiments

First, a first embodiment of the present invention is described.

Figure 1A:
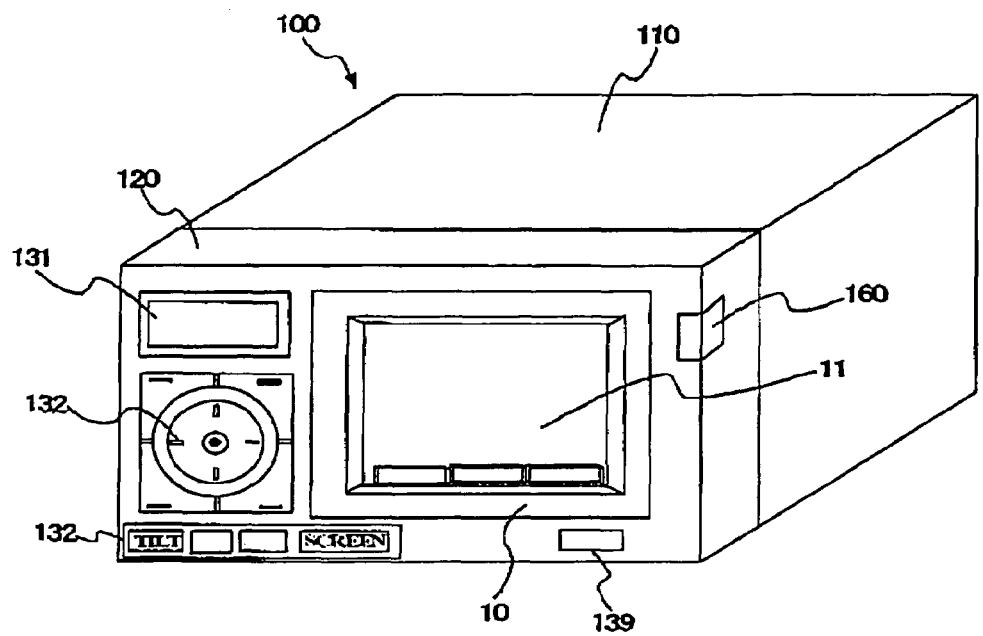
FIGS. 1A and 1B show external views of a vehicle-mounted system.
Figure 1B:
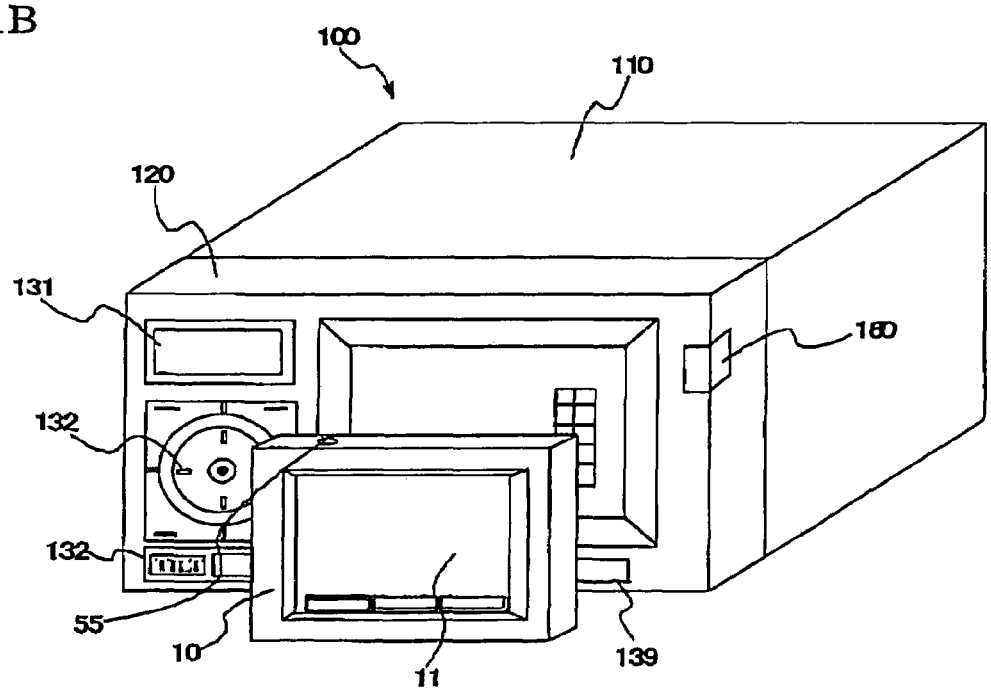

FIGS. 1A and 1B show the external appearance of a vehicle-mounted system 1 that is an example of an electronic system. As shown in FIGS. 1A and 1B, the vehicle-mounted system 1 includes a vehicle-mounted device 100 (an electronic device) that is mounted on a vehicle, and a portable device 10 (a portable electronic device) that has navigating functions. The portable device 10 can be attached to the front-face unit 120 (a cap unit) of the vehicle-mounted device 100 as shown in FIG. 1A. The portable device 10 can also be detached from the vehicle-mounted device 100 as shown in FIG. 1B, and can be used independently of the vehicle-mounted device 100. The vehicle-mounted device 100 may be a vehicle-mounted audio device that reproduces music data, for example. The portable device 10 may be a portable navigator that has navigating functions, for example.

The vehicle-mounted device 100 is a device that can reproduce radio broadcasting, or a device that can reproduce music data written on a recording medium such as a CD (Compact Disc). The vehicle-mounted device 100 includes a vehicle-mounted main unit 110 (the main unit) that has a CD reproducing unit and a CD insertion/ejection slit, and the front-face unit 120 that has a display unit 131 and an operating unit 132.

The portable device 10 has navigating functions, including the function of searching for a guide route to a destination and the function of displaying the guide route superimposed on a map.

Figure 2:
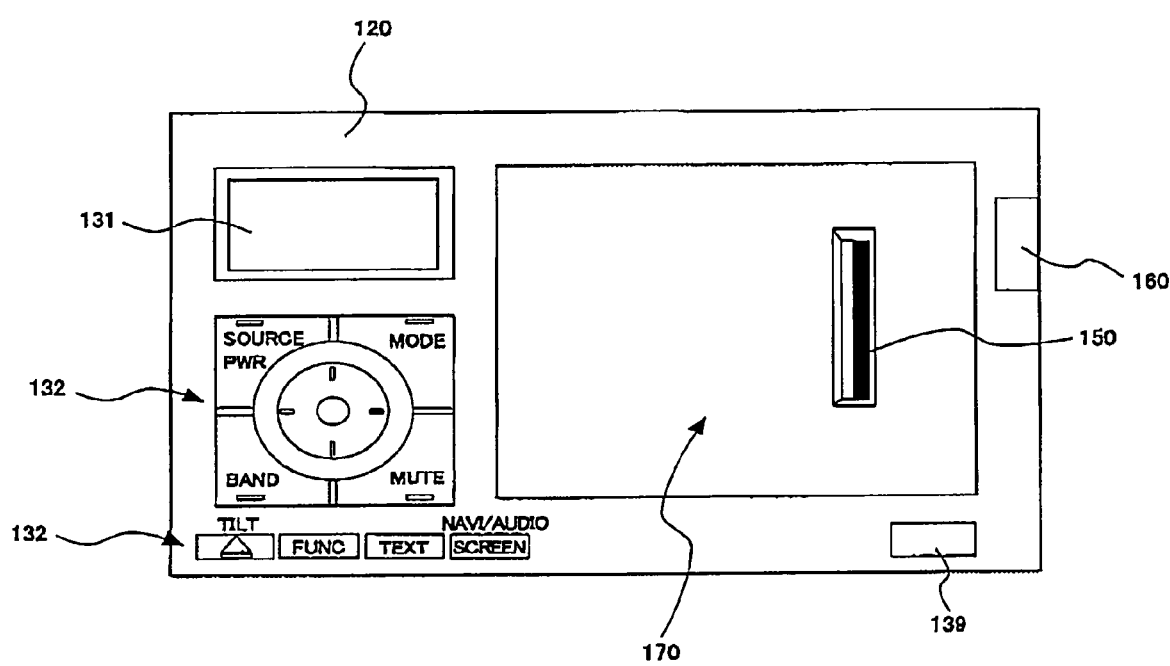
FIG. 2 shows a portable device detached from the vehicle-mounted device.

FIG. 2 shows the vehicle-mounted device 100 (the front-face unit 120), with the portable device 10 being detached from the vehicle-mounted device 100 (the front-face unit 120). An attachment unit 170 that has a concave portion formed to accommodate the portable device 10 is provided on the front-face unit 120 of the vehicle-mounted device 100. This attachment unit 170 has a connector 150 for electrically connecting the vehicle-mounted device 100 and the portable device 10, and a lock mechanism (not shown) for fixing the portable device 10 to the front-face unit 120. When a detachment button 160 provided on the front-face unit 120 is pressed, the lock mechanism (not shown) is released, so that the portable device 10 can be detached from the vehicle-mounted device 100.

Figure 3:
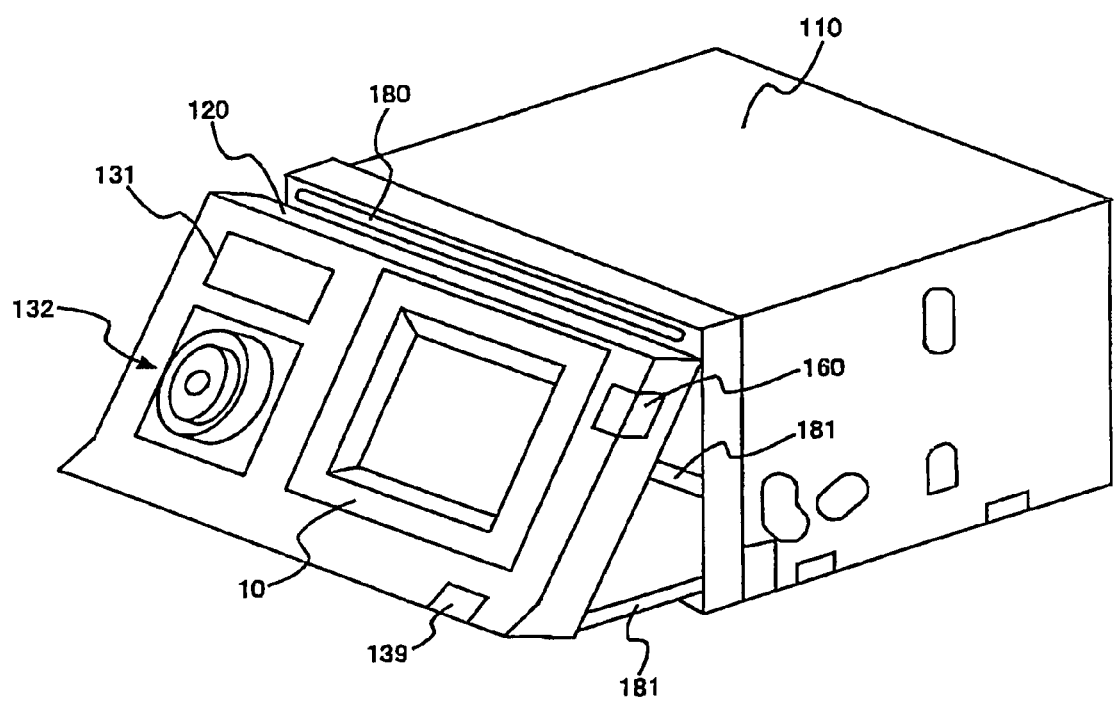
FIG. 3 shows a situation in which the front-face unit of the vehicle-mounted device tilts with respect to the vehicle-mounted device main unit, and the CD insertion/ejection slit is exposed.

FIG. 3 shows a situation in which the front-face unit 120 is tilted with respect to the vehicle-mounted device main unit 110, so as to expose the CD insertion/ejection slit 180.

A slider 181 has one end connected to the lower portion of the front-face unit 120, and slides in the forward and backward directions of the vehicle-mounted device main unit 110, so as to push out and retract the lower portion of the front-face unit 120, with the upper portion of the front-face unit 120 being the supporting point. The slider 181 shown in FIG. 3 is driven in the forward and backward directions of the vehicle-mounted device main unit 110 by the driving mechanism shown in FIG. 9 (described later), so as to cause the front-face unit 120 to tilt with respect to the vehicle-mounted device main unit 110. Through the tilting action, the CD insertion/ejection slit 180 provided in the vehicle-mounted device main unit 110 is exposed, so that a CD can be inserted to and ejected from the device, and the display unit 131 of the vehicle-mounted device 100 and the display unit 11 of the portable device 10 can be adjusted for easier viewing and listening. An operation button (the tilt/eject button 132*a* shown in FIG. 6) is provided on the front-face unit 120 of the vehicle-mounted device 100, and a desired tilt angle can be set by handling this button.

Figure 4:
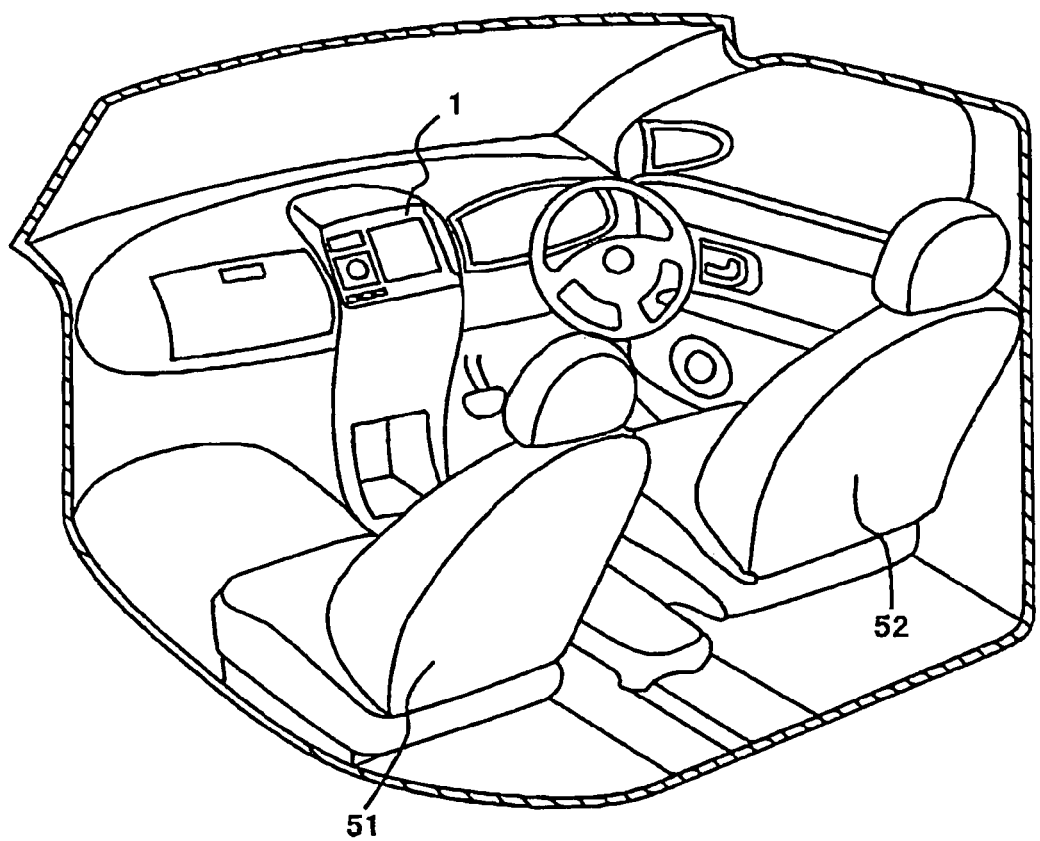
FIG. 4 shows an example case where the vehicle-mounted system is mounted on a vehicle.

FIG. 4 shows an example case where the vehicle-mounted system 1 is mounted in a vehicle.

As shown in FIG. 4, the vehicle-mounted system 1 may be provided in a dashboard area located substantially at the mid point between a driver seat 52 and a front passenger seat 51. Although not shown in the drawing, the GPS antenna of a GPS information receiving unit 133 (described later) is provided on the dashboard or is attached to the inner face of the windshield.

Figure 5:
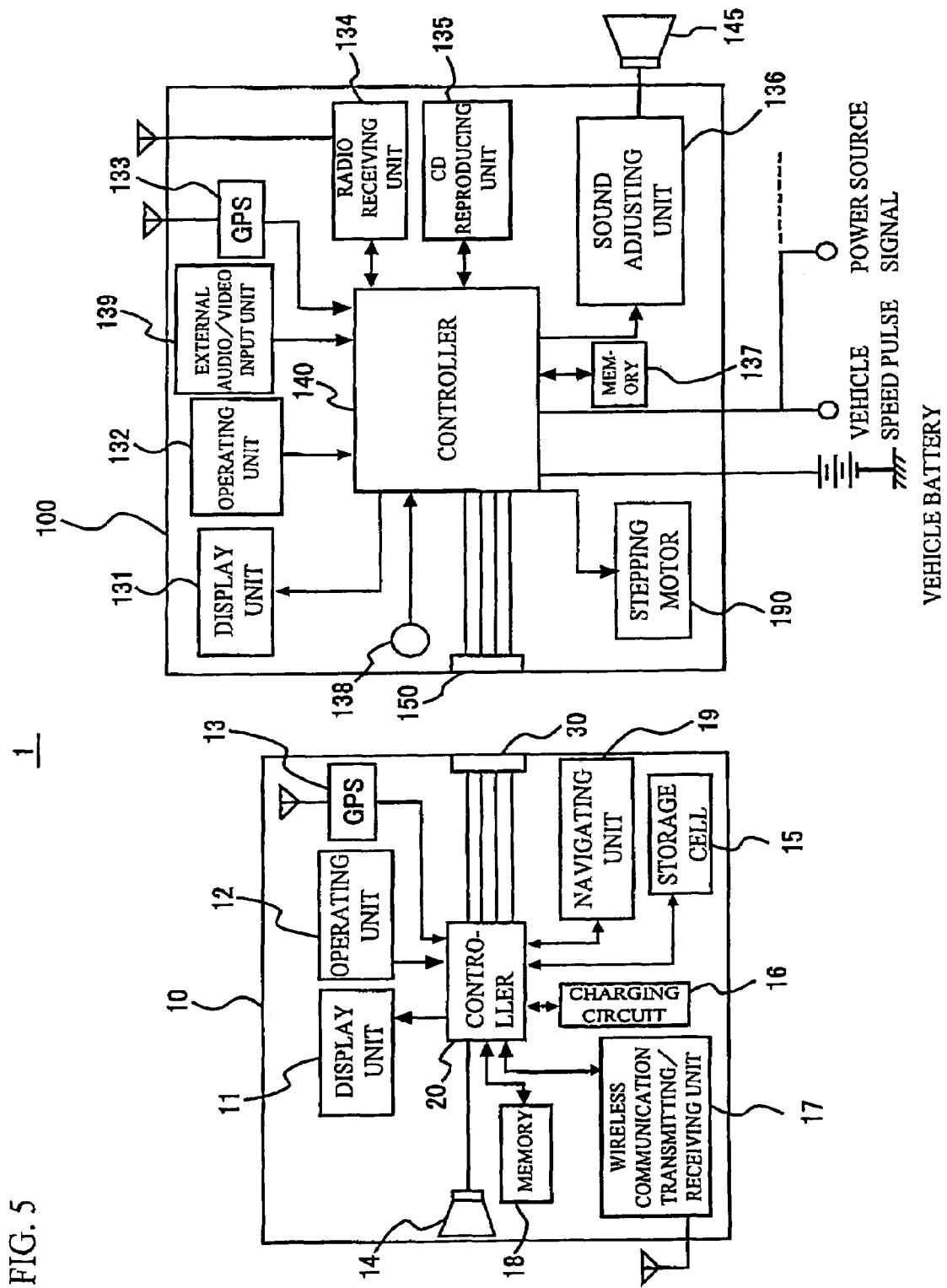
FIG. 5 is a block diagram schematically showing the structure of the vehicle-mounted system.

FIG. 5 is a block diagram schematically showing the structure of the vehicle-mounted system 1.

The vehicle-mounted device 100 and the portable device 10 are electrically connected to each other with connectors. The connector 150 is provided on the side of the vehicle-mounted device 100, and a connector 30 is provided on the portable device 10. Those connectors 150 and 30 are connected to each other, so that various signals are transmitted and received between the vehicle-mounted device 100 and the portable device 10, and the vehicle-mounted device 100 and the portable device 10 function as the vehicle-mounted system 1. Also, power supply terminals for supplying electric power from the battery of the vehicle to the portable device 10 are attached to the connectors 150 and 30. When the portable device 10 is connected to the vehicle-mounted device 100, and electric power is being supplied to the vehicle-mounted device 100, the electric power is also being supplied to the portable device 10 via the power supply terminal.

The vehicle-mounted device 100 includes the display unit 131, the operating unit 132, the GPS. information receiving unit 133, a radio receiving unit 134, a CD reproducing unit 135, a sound adjusting unit 136, a memory 137, a microphone 138, an external audio/video input unit 139, a controller 140 (a controlling unit), the connector 150, and a stepping motor 190. When the engine key is located at Acc or ON position, electric power is supplied from the battery on the vehicle, and the vehicle-mounted device 100 is activated.

In the following, the functions of each component are described in detail.

The display unit 131 has a liquid crystal panel and a backlight, and displays the received broadcasting frequency, the reproduced tune track No., the reproduced tune title, and the likes, by the 13-segment display technique.

Figure 6:
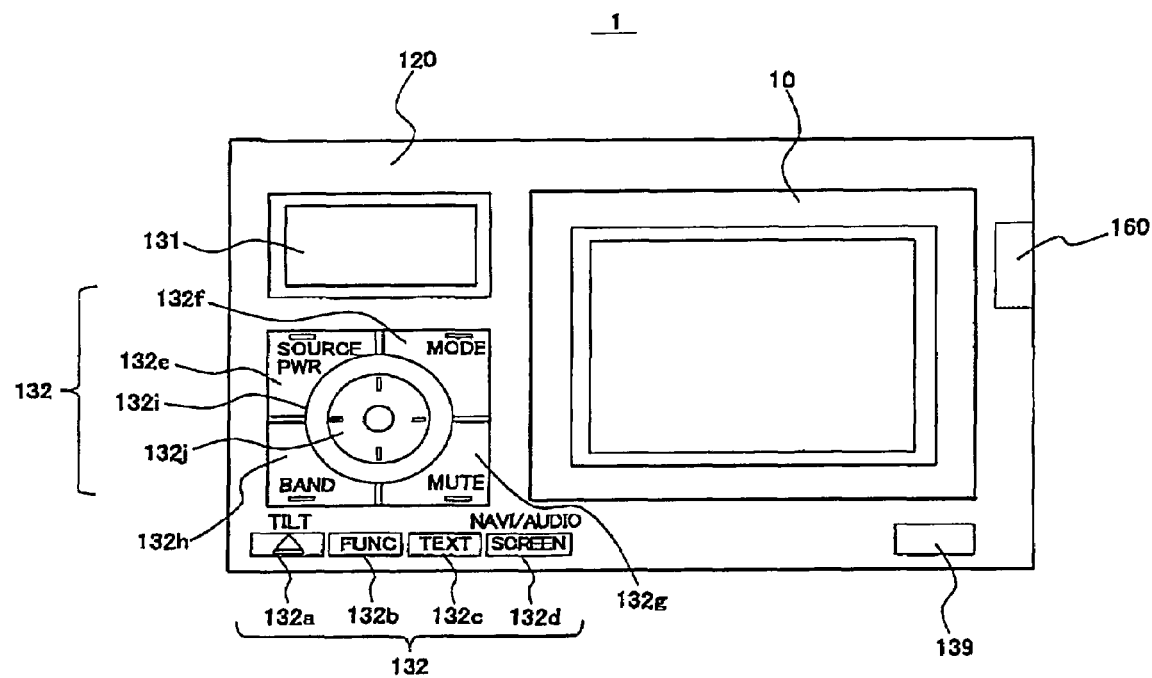
FIG. 6 shows an example of the front-face unit of the vehicle-mounted device.

The operating unit 132 is designed to perform the operation for switching operation modes of the vehicle-mounted device 100, and the operation in each selected mode. As shown in FIG. 6, the operating unit 132 has the group of buttons consisting of the tilt/eject button 132*a*, a function (hereinafter shown as FUNC)/AF button 132*b*, a TEXT button 132*c*, a SCREEN button 132*d*, a SOURCE/PWR button 132*e*, a MODE button 132*f*, a MUTE button 132*g*, a BAND switch button 132*h*, a rotary button 132*i*, and a cross-key/enter-key button 132*j*.

The control operations with the use of the group of buttons are now described.

First, the switching operation for switching displays of the portable device 10 and the vehicle-mounted device 100 with the use of the SOURCE/PWR button 132*e* is described.

The SOURCE/PWR button 132*e* of the vehicle-mounted device 100 is pressed, so as to switch on the vehicle-mounted device 100. While the vehicle-mounted device 100 is on, the SOURCE/PWR button 132*e* is pressed down for a very short time, so as to play a CD or change sources such as radio broadcasting. Here, the display unit 131 of the vehicle-mounted device 100 shows the information about the selected source, and the display unit 11 of the portable device 10 shows a navigation screen, regardless of which source is selected.

When the SCREEN button 132*d* is pressed down, the display on the display unit 11 of the portable device 10 is switched from the navigation screen to an image according to the source selected through the vehicle-mounted device 100.

FIG. 7A shows a situation in which the portable device 10 is attached to the vehicle-mounted device 100 while the vehicle-mounted device 100 is playing a CD, and the portable device 10 is displaying a navigation screen.

When the SOURCE/PWR button 132*e* is pressed down in the situation shown in FIG. 7A so as to change sources from the CD to radio broadcasting, the information about the radio source is displayed on the display unit 131, as shown in FIG. 7B. The display unit 11 of the portable device 10 keeps displaying the navigation screen.

When the user presses the SCREEN button 132*d*, the display unit 11 of the portable device 10 displays an image according to the source that is being processed by the vehicle-mounted device 100 as shown in FIG. 7C (a radio image is shown in FIG. 7C). The display unit 11 of the portable device 10 has a touch panel (described later). The user selects one of the operation buttons displayed on the display unit 11 through the touch panel, so as to carry out the operation for the source that is being processed.

When the SCREEN button 132d is pressed while the radio image is displayed on the display unit 11, the display can be switched back from the radio image to the navigation screen, as shown in FIG. 7D. While the portable device 10 is detached from the vehicle-mounted device 100, the pressing of the SCREEN button 132d becomes invalid.

In a case where a USB (Universal Serial Bus) or the like is connected to the external audio/video input unit 139 while the portable device 10 is detached from the vehicle-mounted device 100, even if the SOURCE/PWR button 132e is pressed down, the display is not switched to the USB source.

The tilting action of the front-face unit 120 that is caused by handling the tilt/eject button 132a is now described.

When the tilt/eject button 132a is operated in the first mode ("short-time pressing", for example), the front-face unit 120 tilts at such an angle as to expose the CD insertion/ejection slit 180. When the tilt/eject button 132a is operated in the second mode ("long-time pressing", for example), the front-face unit 120 tilts at a predetermined angle each time.

Referring back to FIG. 5, the GPS information receiving unit 133 has a GPS antenna and a tuner unit, and receives GPS signals from satellites. Each GPS signal received by the GPS information receiving unit 133 is output to the navigating unit 19 of the portable device 10 via the controller 140, the connector 150, the connector 30, and a controller 20. Based on the GPS signal, the location of the vehicle on which the vehicle-mounted device 100 accommodating the portable device 10 is mounted is determined.

Alternatively, each GPS signal received by the GPS information receiving unit 133 may be output to the navigating unit 19 of the portable device 10 via the controller 20, without involving the controller 20. Also, the GPS information receiving unit 133 may be formed only with a GPS antenna, and each GPS signal received at the GPS antenna may be output to the tuner of a GPS information receiving unit 13 (described later), with the controller 140 and the controller 20 being not involved. Each GPS signal may also be output to the tuner of the GPS information receiving unit 13 via the controller 20, with the controller 140 being not involved. It is possible to make other modifications to the above arrangements.

The radio receiving unit 134 has an antenna and a tuner unit, and receives broadcast wave such as AM broadcast wave, FM broadcast wave, or multiple broadcast wave. The radio receiving unit 134 then outputs an audio signal, receives and demodulates multiple data, and outputs a demodulated signal to the controller 140.

The CD reproducing unit 135 reproduces the data recorded on a CD, and outputs a reproduction signal to the controller 140. Alternatively, the demodulated signal that is output from the radio receiving unit 134 may be output to the later described sound adjusting unit 136, with the controller 140 being not involved.

The sound adjusting unit 136 performs signal processing such as sound volume adjustment or sound quality adjustment on the audio signal that is received and demodulated by the radio receiving unit 134 or the audio signal that is reproduced by the CD reproducing unit 135. The sound adjusting unit 136 then outputs the processed signal to a speaker 145. The memory 137 (a memory unit) can be formed with a RAM (Random Access Memory) on and from which data can be written and read. The information required for controlling operations, such as the tilting state of the front-face unit 120 (the tilt angle information indicating the tilt angle), is temporarily stored in the memory 137.

The microphone 138 is designed for communication in a handsfree fashion, and captures the voice of users in the vehicle. The external audio/video input unit 139 has a USB memory and a connection terminal for a connection to an external device such as a portable audio device. The external audio/video input unit 139 receives audio signals or data from an external device, and transmits the audio signals or data to the controller 140. The external audio/video input unit 139 also outputs control signals, audio signals, or data received from the controller 140 to a connected external device.

In accordance with an operation through the operating unit 132, the controller 140 controls the radio receiving unit 134, the CD reproducing unit 135, and the sound adjusting unit 136.

The controller 140 also outputs various signals to the portable device 10 via the connector 150. Based on various signals that are input from the portable device 10, the controller 140 controls the vehicle-mounted device 100. For example, the controller 140 outputs a GSP signal that is received through the GPS information receiving unit 133 or an audio signal that is input through the microphone 138 to the portable device 10 via the connector 150.

Alternatively, an audio signal that is input through the microphone 138 may be output to the portable device 10 via the connector 150, with the controller 140 being not involved.

The controller 140 also receives a speech voice, via the connector 150, from a portable telephone device connected to the portable device 10. The controller 140 then outputs the speech voice to the speaker 145 via the sound adjusting unit 136. The controller 140 further obtains an operation signal for the menu screen of each mode to be displayed on the display unit 11 of the portable device 10, and controls the radio receiving unit 134 and the CD reproducing unit 135.

Electric power is supplied to the controller 140 from the battery mounted on the vehicle. If the portable device 10 is connected to the vehicle-mounted device 100, the controller 140 outputs the electric power from the battery to the portable device 10. A vehicle-speed pulse and an illumination source signal are also input from the vehicle to the controller 140. The controller 140 transfers the vehicle-speed pulse to the controller 20 of the portable device 10. Alternatively, the vehicle-speed pulse may not be input to the controller 140 in the first place.

The stepping motor 190 is used to push the slider 181 shown in FIG. 3 out of the vehicle-mounted device 100, or to pull the slider 181 back to the vehicle-mounted device 100. By inputting a pulse signal to the stepping motor 190, the controller 140 controls the rotation angle of a gear (not shown) attached to the stepping motor 190.

Figure 8:
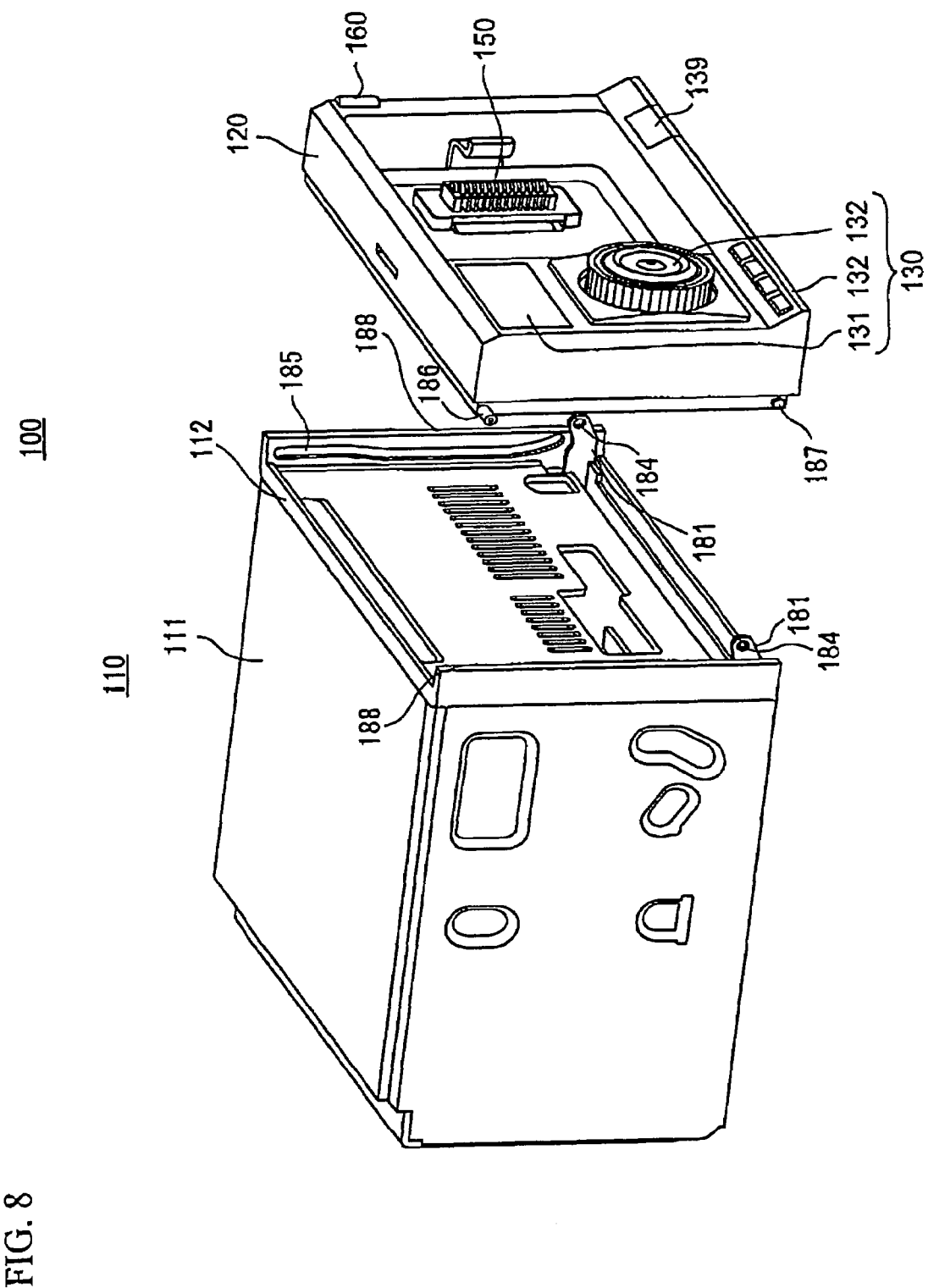
FIG. 8 shows the engaging relationship between the vehicle-mounted device main unit and the front-face unit.

FIG. 8 shows the engaging relationship between the vehicle-mounted device main unit 110 and the front-face unit 120.

The vehicle-mounted device main unit 110 is formed with a main frame 111 and a front-face panel 112. The front-face panel 112 has slide grooves formed in both inner side faces 188. The slide grooves are designed to cause engaging pins 186 to slide freely. The engaging pins 186 are provided at the upper portions of the left and right side faces of the front-face unit 120. Screw holes 184 formed in the slider 181 are fixed with screws (not shown) to screw holes 187 formed at the lower portions of the left and right side faces of the front-face unit 120.

Figure 9:
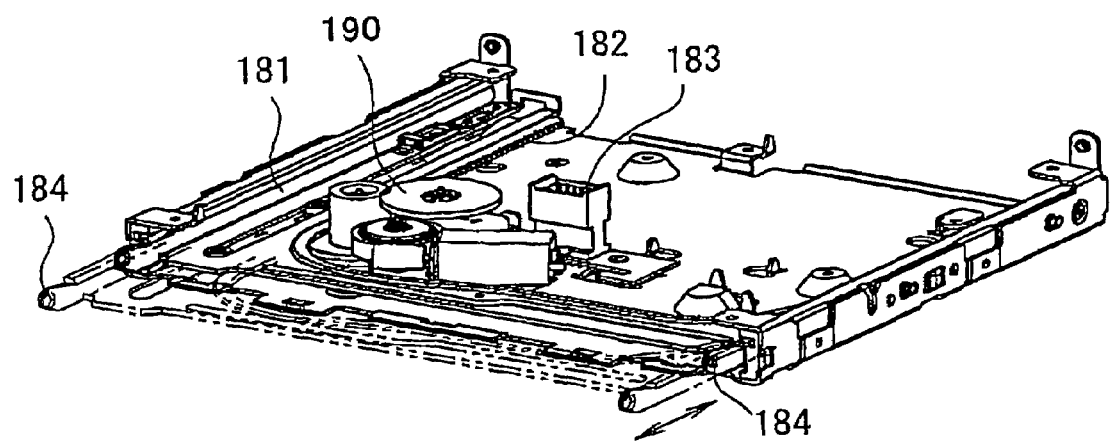
FIG. 9 shows the stepping motor and the slider provided at the bottom portion in the vehicle-mounted device.

FIG. 9 shows the stepping motor 190 and the slider 181 provided at the bottom portion in the vehicle-mounted device 100.

The stepping motor 190, the slider 181 having a rectangular shape minus one side, and a connector 183 for connecting with the substrate (not shown) having the controller 140 mounted thereon are provided at the bottom portion inside the vehicle-mounted device 100. The slider 181 has sawing teeth 182. The sawing teeth 182 are to be engaged with the gear (not shown) of the stepping motor 190. Accordingly, when the gear of the stepping motor 190 revolves, the slider 181 moves back and forth in the depth direction of the vehicle-mounted device main unit 110. With this action, the lower portion of the front-face unit 120 moves back and forth in the depth direction of the vehicle-mounted device main unit 110, and the engaging pins 186 of the front-face unit 120 slide along the slide grooves 185, so as to cause the front-face unit 120 to tilt with respect to the vehicle-mounted device main unit 110. The virtual line shown in FIG. 9 indicates the location of the slider 181 when the slider 181 is pushed out of the vehicle-mounted device main unit 110.

The stepping motor 190, the gear of the stepping motor 190, and the slider 181 are equivalent to the driving unit in the claims.

The portable device 10 is now described. The portable device 10 includes the display unit 11, the operating unit 12, the GPS information receiving unit 13, the speaker 14, a storage cell 15, a cell charging circuit 16, a wireless communication transmitting/receiving unit 17, a memory 18, the navigating unit 19, the controller 20, and the connector 30.

The functions of each of the components are now described in detail.

The display unit 11 includes a liquid crystal panel and a backlight. The display unit 11 can display map information or destination guide route information that is generated by the navigating unit 19, or the received broadcasting frequency, the reproduced tune track No., the reproduced tune title, or the like that is transferred from the vehicle-mounted device 100. Each of the display units 11 and 131 may not be formed with a liquid crystal panel, but may be formed with some other flat panel display such as an organic EL display panel, a plasma display panel, or a cold-cathode flat display panel.

The operating unit 12 includes a touch panel and a power switch button 55 (see FIG. 10A) for switching on and off the power source of the portable device 10. The touch panel may be placed on the display screen of the display unit 11, for example. When the touch panel is touched with a finger or a special-purpose pen, the touched point is spotted, and an input operation is detected. The power switch button 55 will be described later.

The GPS information receiving unit 13 includes an antenna and a tuner unit, and receives GPS signals from satellites. Each received GPS signal is output to the navigating unit 19, and the location of the device is determined from the GPS signal. The vehicle-mounted device 100 also has the GPS information receiving unit 133 mounted thereon. When the portable device 10 is attached to the vehicle-mounted device 100, the location of the vehicle on which the vehicle-mounted device 100 accommodating the portable device 10 is mounted is determined from a GPS signal (and a vehicle speed pulse) received by the GPS information receiving unit 133. When the portable device 10 is used independently of the vehicle-mounted device 100, the location of the portable device 10 is determined from a GPS signal received by the GPS information receiving unit 13.

The speaker 14 is designed to output audio information that is supplied from the navigating unit 19. When the portable device 10 is detached from the vehicle-mounted device 100 or is used independently of the vehicle-mounted device 100, the speaker 14 outputs audio information.

The storage cell 15 supplies electric power to each component of the portable device 10. When the portable device 10 is attached to the vehicle-mounted device 100, electric power is supplied from the battery of the vehicle via the power supply terminal of the connector 30, and the storage cell 15 is charged by the charging circuit 16. The charging circuit 16 receives electric power from a connected terminal via a USB slot (see FIG. 10A), and then charges the storage cell 15.

The wireless communication transmitting/receiving unit 17 exchanges communication voices with a portable telephone device, and obtains information to be used for navigations via a portable telephone device. The wireless communication transmitting/receiving unit 17 may utilize Bluetooth, which is a 2.4-GHz band wireless transmission method.

The memory 18 may be a RAM on which reading and writing can be performed. Information that is read for each controlling operation is temporarily stored in the memory 18.

The navigating unit 19 includes a map information storage unit that obtains and stores map information from a SD card or a USB memory (described later) that stores the map information to be used for navigations. In accordance with a GPS signal supplied from the GPS information receiving unit 133 or 13, the navigating unit 19 detects the current location information, and creates an image to be used in a navigating operation. The created map can be displayed on the display unit 11. When the portable device 10 is connected to the vehicle-mounted device 100, the vehicle speed pulse is obtained from the vehicle, so as to increase the accuracy of determining the location of the vehicle on which the vehicle-mounted device 100 accommodating the portable device 10 is mounted.

Alternatively, the map information may be stored in the portable device 10.

The controller 20 controls each of the components of the portable device 10. The controller 20 also outputs various signals to the vehicle-mounted device 100 via the connector 30, and, based on various signals that are input from the vehicle-mounted device 100, controls the portable device 10. For example, the controller 20 obtains a GPS signal and a vehicle speed pulse received by the GPS information receiving unit 133 of the vehicle-mounted device 100, from the controller 140 of the vehicle-mounted device 100. The controller 20 then outputs the GPS signal and the vehicle speed pulse to the navigating unit 19.

The controller 20 also obtains an audio signal that is input through the microphone 138 of the vehicle-mounted device 100, from the controller 140 of the vehicle-mounted device 100. In accordance with the audio signal, the controller 20 controls the navigating unit 19. Accordingly, the navigating unit 19 can be operated in a handsfree fashion. The controller 20 also outputs communication-voices from a portable telephone device connected to the wireless communication transmitting/receiving unit 17, to the vehicle-mounted device 100 via the connector 30, so that the communication voices can be output from the speaker 145 of the vehicle-mounted device 100. The controller 20 also outputs an operation signal for a menu screen or a content screen displayed on the display unit 11, to the controller 140 of the vehicle-mounted device 100 via the connector 30. In accordance with the operation signal transmitted from the controller 20 of the portable device 10, the controller 140 controls the radio receiving unit 134 and the CD reproducing unit 135.

Figure 10A:
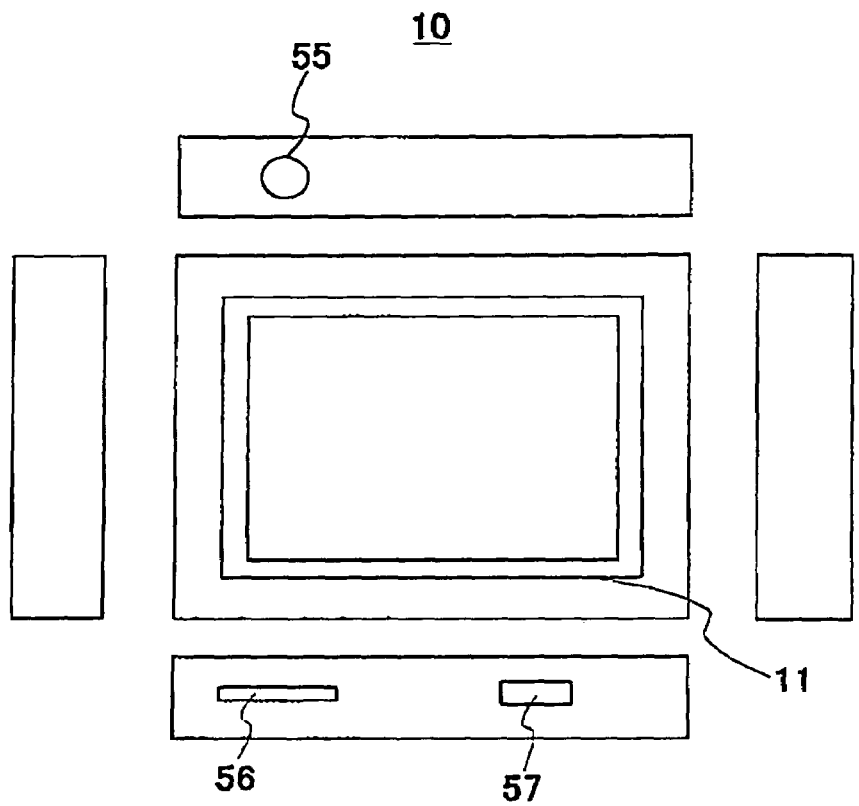
FIG. 10A shows a front view, a top view, a bottom view, a left side view, and a right side view of the portable device.
Figure 10B:
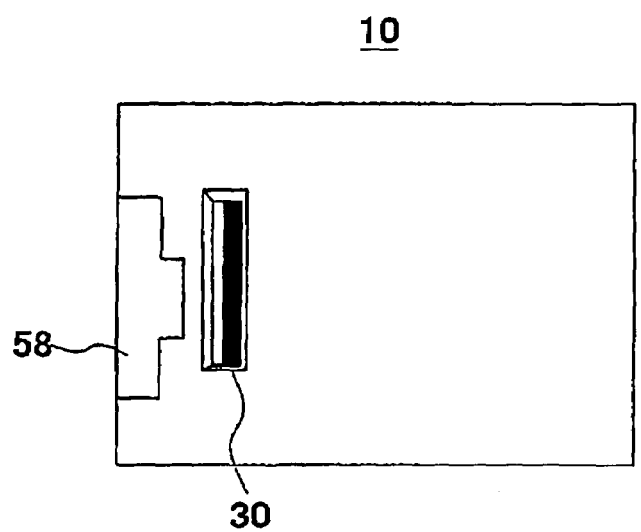
FIG. 10B is a back view of the portable device.

FIG. 10A shows a front view, a top view, a bottom view, a left side view, and a right side view of the portable device 10. FIG. 10B shows a back view of the portable device 10.

The power switch button 55 for switching on and off the power source of the portable device 10 is provided on the top face of the portable device 10. A SD (Secure Digital) memory card slot 56 and a USB slot 57 are formed in the bottom face of the portable device 10. A SD card or a USB memory having map information recorded thereon is inserted to the respective slots, so that the controller 20 can read the map information from the SD card or the USB memory, and output the map information to the navigating unit 19.

When the portable device 10 is attached to the vehicle-mounted device 100, the power source of the portable device 10 is switched on and off under the control of the vehicle-mounted device 100. When the portable device 10 is detached from the vehicle-mounted device 100 and is used independently, the power source is operated through ON and OFF operations of the power switch button 55.

The connector 30 for establishing an electric connection with the vehicle-mounted device 100, and an engaging portion 58 to be engaged with the lock mechanism (not shown) of the vehicle-mounted device 100 are provided on the back face of the portable device 10.

Figure 11:
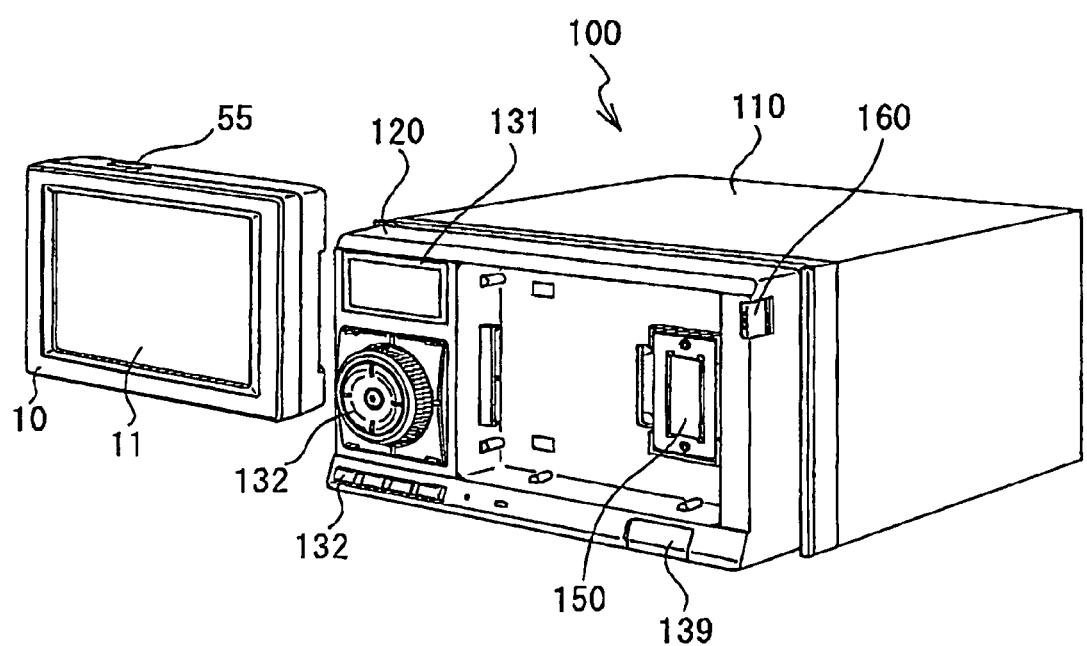
FIG. 11 is an external view of the vehicle-mounted system in accordance with the first embodiment.

FIG. 11 is an actual external view equivalent to the schematic external view of the vehicle-mounted device 100 and the portable device 10 shown in FIG. 1A. The same components as those shown in FIG. 1B are denoted by the same reference numerals as those in FIG. 1B, and explanation of them is omitted here.

Figures 12A, 12B, 12C, 12D:
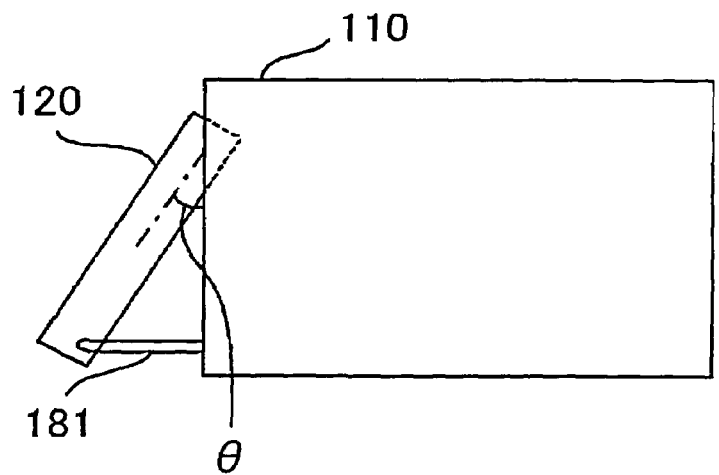
FIGS. 12A and 12B show examples of table information that is stored in the memory of the vehicle-mounted device.
FIG. 12C is a schematic side view of the vehicle-mounted system.
FIG. 12D is an example of table information that is stored in the memory of the vehicle-mounted device.

FIGS. 12A and 12B show an example of table information that is stored in the memory 137 of the vehicle-mounted device 100. FIG. 12C is a schematic side view of the vehicle-mounted system 1. FIG. 12D shows the information about the state of the front-face unit 120 that is stored in the memory 137 of the vehicle-mounted device 100.

The information shown in FIGS. 12A, 12B, and 12D may not be recorded on the memory 137, but may be stored in or recorded on a memory provided inside the controller 140.

The table information shown in FIG. 12A indicates the relationship among the number of times the tilt/eject button 132a (see FIG. 6) is pressed in the second mode (a tilt instruction: long pressing, for example), the tilt angle θ (see FIG. 12C) indicating the tilting of the front-face unit 120 with respect to the vehicle-mounted device main unit 110, and the number of pulses in the pulse signal that is output from the controller 140 to the stepping motor 190.

As indicated in the table information shown in FIG. 12A, every time the tilt/eject button 132a is pressed in the second mode, the controller 140 outputs a pulse signal having ten pulses to the stepping motor 190, so that the tilt angle θ increases by 5 degrees. A pulse signal has one pulse indicating a one-time ON operation and a one-time OFF operation (one cycle in total), and the tilt angle θ increases by 0.5 degrees with one pulse.

If the tilt/eject button 132a is pressed seven times in the second mode, the front-face unit 120 returns to the initial position (at 0 degrees). In that case, the record next to the number of pressing times "6" in the table information shown in FIG. 12A is a record of the number of pressing times "0".

More specifically, if the tilt/eject button 132a is pressed once after the tilt/eject button 132a is pressed six times in the second mode and the tilt angle of the front-face unit 120 is adjusted, a pulse signal of a different polar character from that of the pulse signal that increases the above described tilt angle θ is output from the controller 140 to the stepping motor 190, and the front-face unit 120 is displaced in such a direction as to reduce the tilt angle θ.

The maximum tilt angle (indicated by the record of the number of pressing times "6") obtained through operations of the tilt/eject button 132a in the second mode should preferably be such an angle as not to expose the CD insertion/ejection slit 180.

It should be noted that the tilt angles and the number of records are not limited to the numeric values shown in the table.

The table information shown in FIG. 12B indicates the relationship between the tilt angle (see FIG. 12C) representing the tilting of the front-face unit 120 with respect to the vehicle-mounted device main unit 110 when the front-face unit 120 is in an open state, and the number of pulses in the pulse signal that is output from the controller 140 to the stepping motor 190.

The tilt angle of the front-face unit 120 in an open state is not limited to the numeric value shown in this table, and should be such an angle as to expose the CD insertion/ejection slit 180. Also, the tilt angle of the front-face unit 120 in an open state may be such an angle that the front-face unit 120 is laid completely flat.

As shown in FIG. 12D, the memory 137 stores the current tilt angle θ and the open/closed state of the front-face unit 120, or stores and updates the current tilt angle θ as the tilt angle θ of the front-face unit 120 adjusted by pressing the tilt/eject button 132a in the second mode, and the open/closed state of the front-face unit 120 displaced by pressing the tilt/eject button 132a in the first mode.

Figure 13A:
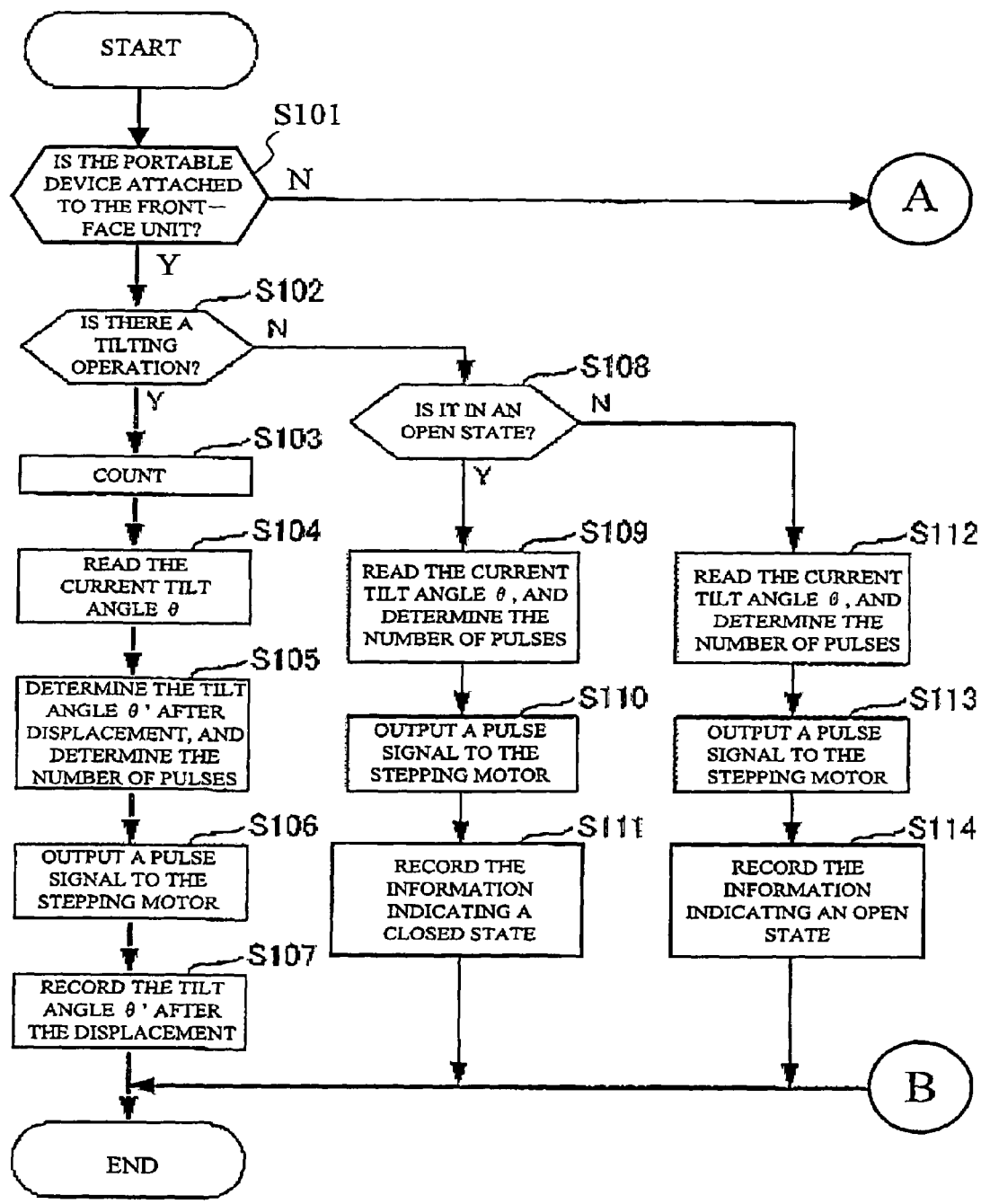
FIGS. 13A and 13B are flowcharts showing a controlling operation to be performed by the controller of the vehicle-mounted device to control the stepping motor.
Figure 13B:
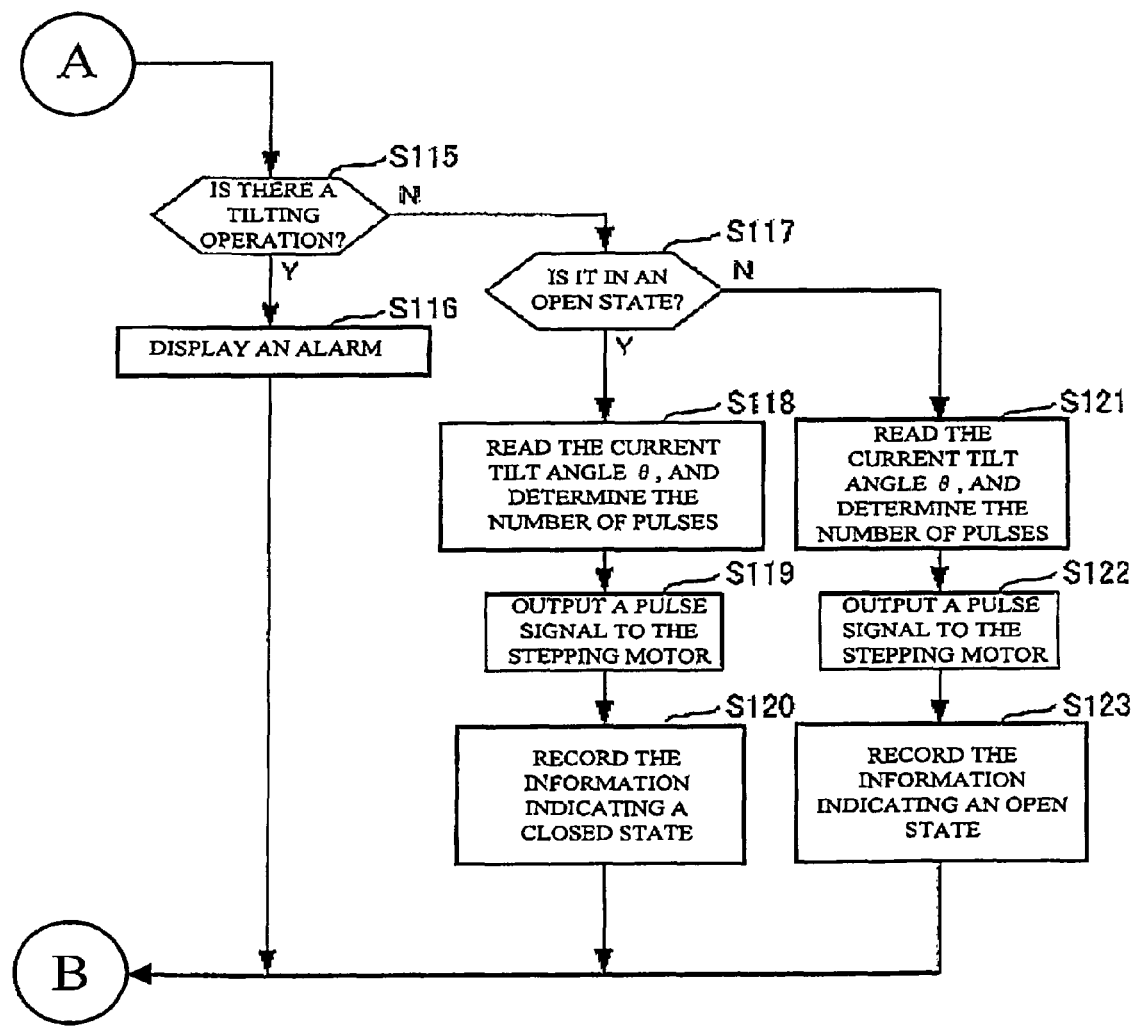

FIGS. 13A and 13B are flowcharts showing a controlling operation to be performed by the controller 140 of the vehicle-mounted device 100 when the tilt/eject button 132a is handled.

As described above (as shown in FIG. 12D), the memory 137 stores the current tilt angle θ as the tilt angle θ of the front-face unit 120 adjusted by pressing the tilt/eject button 132a in the second mode, and the open/closed state of the front-face unit 120 displaced by pressing the tilt/eject button 132a in the first mode.

This controlling operation shown in FIGS. 13A and 13B is started when the controller 140 detects a user pressing the tilt/eject button 132a.

First, the controller 140 determines whether the portable device 10 is attached to the front-face unit 120 of the vehicle-mounted device 100 (step S101). More specifically, the controller 140 transmits a connection signal to the controller 20 at regular intervals or in desired timing. If the controller 140 receives a response from the controller 20, the controller 140 determines that the portable device 10 is attached to the front-face unit 120 of the vehicle-mounted device 100. Alternatively, a change in the connecting state may be detected by checking the operating state of the detachment button 160, or a structure for detecting a change in the connecting state may be specially provided. Other methods and techniques may also be utilized to detect a change in the connecting state.

If the controller 140 determines in step S101 that the portable device 10 is attached to the front-face unit 120 of the vehicle-mounted device 100, the controller 140 determines whether the operating mode of the tilt/eject button 132a is the second mode (a tilt instruction) or the first mode (an open/close instruction) (step S102).

If the controller 140 determines in step S102 that the pressing of the tilt/eject button 132a by a user is to issue a tilt instruction (the second mode: long pressing (for 1.7 seconds or longer, for example)), the controller 140 counts the number of times the tilt/eject button 132a is pressed in the second mode (the tilt instruction) (step S103). The controller 140 then reads the current tilt angle θ from the memory 137 (the table information shown in FIG. 12D) (step S104).

As described above, the memory 137 stores the current tilt angle θ as the tilt angle θ of the front-face unit 120 displaced by pressing the tilt/eject button 132a in the second mode (a tilt instruction), as shown in FIG. 12D.

Instead of the current tilt angle θ, the information about the current tilt angle θ may be stored in the memory 137.

Based on the current tilt angle θ read from the memory 137 in step S104, the number of pressing times of the tilt/eject button 132a counted in step S103, and the table information shown in FIG. 12A and stored in the memory 137, the controller 140 determines the tilt angle θ' of the post-displacement, and also determines the number of pulses to be output to the stepping motor 190 in accordance with the current tilt angle θ and the tilt angle θ' of the post-displacement (step S105).

To cause the front-face unit 120 to tilt at the tilt angle θ' of the post-displacement, the controller 140 outputs a pulse signal having the pulses determined in step S105 to the stepping motor 190 (step S106). The stepping motor 190 then drives the slider 181 by an amount equivalent to the number of pulses in the pulse signal supplied from the controller 140. Accordingly, the front-face unit 120 is displaced at the predetermined tilt angle θ'. The controller 140 updates and stores the tilt angle θ' as the current tilt angle θ in the memory 137 (the table information shown in FIG. 12D) (step S107), and ends this operation.

As described above, in a case where the portable device 10 is attached to the front-face unit 120, the front-face unit 120 can be displaced (can tilt) with respect to the vehicle-mounted device main unit 110, based on the number of times the tilt/eject button 132a is pressed for a tilt instruction (the second mode) and the table information shown in FIG. 12A.

If the controller 140 determines in step S102 that the pressing of the tilt/eject button 132a by the user is in the first mode (an open/close instruction: short pressing (for less than 1.7 seconds, for example)), the controller 140 determines whether the front-face unit 120 is in an open state, based on the information stored in the memory 137 (the table information shown in FIG. 12D) (step S108).

As shown in FIG. 12D, the memory 137 stores the information indicating that the front-face unit 120 is in an open state or a closed state, and also stores the initial value (the information indicating a closed state if an eject instruction through the tilt/eject button 132a has not been made in the past).

If the controller 140 determines in step S108 that the front-face unit 120 is in an open state, the pressing is to issue an instruction to displace the front-face unit 120 from an open state to a closed state. Therefore, the controller 140 reads the current tilt angle θ (the tilt angle observed before the front-face unit 120 is put into the open state) from the memory 137 (the table information shown in FIG. 12D), and determines the number of pulses to be output to the stepping motor 190 so as to put the front-face unit 120 back into the state observed before the front-face unit 120 is put into the open state (at the current tilt angle θ), based on the read current tilt angle θ and the table information stored in the memory 137 and shown in FIGS. 12A and 12B (step S109).

To cause the front-face unit 120 to tilt at the current tilt angle θ (the tilt angle observed before the front-face unit 120 is put into the open state), the controller 140 outputs a pulse signal having the pulses determined in step S109 to the stepping motor 190 (step S110). The stepping motor 190 then drives the slider 181 by an amount equivalent to the number of pulses in the pulse signal supplied from the controller 140. Accordingly, the front-face unit 120 is displaced at the current tilt angle θ (the tilt angle observed before the front-face unit 120 is put into the open state). The controller 140 then updates and stores the information indicating that the front-face unit 120 is in a closed state in the memory 137 (the table information shown in FIG. 12D) (step S111), and ends this operation.

If the controller 140 determines in step S108 that the front-face unit 120 is not in an open state, the pressing is to issue an instruction to displace the front-face unit 120 from a closed state to an open state. Therefore, the controller 140 reads the current tilt angle θ from the memory 137 (the table information shown in FIG. 12D), and determines the number of pulses to be output to the stepping motor 190 so as to put the front-face unit 120 into an open state, based on the read current tilt angle θ and the table information stored in the memory 137 and shown in FIGS. 12A and 12B (step S112).

To put the front-face unit 120 into an open state, the controller 140 outputs a pulse signal having the pulses determined in step S112 to the stepping motor 190 (step S113). The stepping motor 190 then drives the slider 181 by an amount equivalent to the number of pulses in the pulse signal supplied from the controller 140. Accordingly, the front-face unit 120 is displaced into an open state. The controller 140 then updates and stores the information indicating that the front-face unit 120 is in an open state in the memory 137 (the table information shown in FIG. 12D) (step S114), and ends this operation.

As described above, in a case where the portable device 10 is attached to the front-face unit 120, the front-face unit 120 can be displaced (can tilt) with respect to the vehicle-mounted device main unit 110, based on the number of times the tilt/eject button 132a is pressed for an open/close instruction (the first mode) and the table information shown in FIGS. 12A and 12B.

The table information shown in FIG. 12B may not be stored in the memory 137, but a detecting unit (such as a limit switch) for detecting such a state (an open state) as to expose the CD insertion/ejection slit 180 based on the amount of movement of the slider 181 or the like may be provided instead. In such a case, the detection results of the detecting unit may be stored in the memory 137, instead of the information indicating whether the front-face unit 120 is in an open state or a closed state as shown in FIG. 12D, and the open/closed state of the front-face unit 120 may be determined from the detection results.

In such a case, when an open instruction is issued from a user, the output of a pulse signal to the stepping motor 190 is continued until the detecting unit determines that the front-face unit 120 is put into an open state.

Meanwhile, if the controller 140 determines in step S101 that the portable device 10 is not attached to the front-face unit 120 of the vehicle-mounted device 100, the controller 140 determines whether the operating mode of the tilt/eject button 132a is the second mode (a tilt instruction) or the first mode (an open/close instruction) (step S115).

If the controller 140 determines in step S115 that the pressing of the tilt/eject button 132a by a user is to issue a tilt instruction (the second mode: long pressing (for 1.7 seconds or longer, for example)), the controller 140 causes the display unit 131 to display an alarm to the effect that the front-face unit 120 cannot be displaced (step S116), and ends this operation. Instead of an alarm to the effect that the front-face unit 120 cannot be displaced, an audio output or an alarm noise to the effect that the front-face unit 120 cannot be displaced may be output from the speaker 145, or an instruction or a voice instruction may be output to the user so as to attach the portable device 10 to the front-face unit 120.

As described above, in a case where the portable device 10 is not attached to the front-face unit 120, adjustment of the tilt angle of the front-face unit 120 in response to a tilt instruction (the second mode) through the tilt/eject button 132a can be restricted.

Furthermore, by virtue of an alarm on the display unit or the like, trouble or a failure of the vehicle-mounted device 100 is not wrongly detected, even if the front-face unit 120 is not driven by pressing the tilt/eject button 132a.

Meanwhile, if the controller 140 determines in step S115 that the pressing of the tilt/eject button 132a by the user is in the first mode (an open/close instruction: short pressing (for less than 1.7 seconds, for example)), the controller 140 determines whether the front-face unit 120 is in an open state, based on the information stored in the memory 137 (the table information shown in FIG. 12D) (step S117).

As shown in FIG. 12D, the memory 137 stores the information indicating that the front-face unit 120 is in an open state or a closed state, and also stores the initial value (the information indicating a closed state if an eject instruction through the tilt/eject button 132a has not been made in the past).

If the controller 140 determines in step S117 that the front-face unit 120 is in an open state, the pressing is to issue an instruction to displace the front-face unit 120 from an open state to a closed state. Therefore, the controller 140 reads the current tilt angle θ (the tilt angle observed before the front-face unit 120 is put into the open state) from the memory 137 (the table information shown in FIG. 12D), and determines the number of pulses to be output to the stepping motor 190 so as to put the front-face unit 120 back into the state observed before the front-face unit 120 is put into the open state (at the current tilt angle θ), based on the read current tilt angle θ and the table information stored in the memory 137 and shown in FIGS. 12A and 12B (step S118).

To cause the front-face unit 120 to tilt at the current tilt angle θ (the tilt angle observed before the front-face unit 120 is put into the open state), the controller 140 outputs a pulse signal having the pulses determined in step S118 to the stepping motor 190 (step S119). The stepping motor 190 then drives the slider 181 by an amount equivalent to the number of pulses in the pulse signal supplied from the controller 140. Accordingly, the front-face unit 120 is displaced at the current tilt angle θ (the tilt angle observed before the front-face unit 120 is put into the open state). The controller 140 then updates and stores the information indicating that the front-face unit 120 is in a closed state in the memory 137 (the table information shown in FIG. 12D) (step S120), and ends this operation.

If the controller 140 determines in step S117 that the front-face unit 120 is not in an open state, the pressing is to issue an instruction to displace the front-face unit 120 from a closed state to an open state. Therefore, the controller 140 reads the current tilt angle θ from the memory 137 (the table information shown in FIG. 12D), and determines the number of pulses to be output to the stepping motor 190 so as to put the front-face unit 120 into an open state, based on the read current tilt angle θ and the table information stored in the memory 137 and shown in FIGS. 12A and 12B (step S121).

To put the front-face unit 120 into an open state, the controller 140 outputs a pulse signal having the pulses determined in step S121 to the stepping motor 190 (step S122). The stepping motor 190 then drives the slider 181 by an amount equivalent to the number of pulses in the pulse signal supplied from the controller 140. Accordingly, the front-face unit 120 is displaced into an open state. The controller 140 then updates and stores the information indicating that the front-face unit 120 is in an open state in the memory 137 (the table information shown in FIG. 12D) (step S123), and ends this operation.

As described above, in a case where the portable device 10 is not attached to the front-face unit 120, the front-face unit 120 can be displaced (can tilt) with respect to the vehicle-mounted device main unit 110, based on the number of times the tilt/eject button 132a is pressed for an open/close instruction (the first mode) and the table information shown in FIGS. 12A and 12B.

The table information shown in FIG. 12B may not be stored in the memory 137, but a detecting unit (such as a limit switch) for detecting such a state (an open state) as to expose the CD insertion/ejection slit 180 based on the amount of movement of the slider 181 or the like may be provided instead. In such a case, the detection results of the detecting unit may be stored in the memory 137, instead of the information indicating whether the front-face unit 120 is in an open state or a closed state as shown in FIG. 12D, and the open/closed state of the front-face unit 120 may be determined from the detection results.

In such a case, when an open instruction is issued from a user, the output of a pulse signal to the stepping motor 190 is continued until the detecting unit determines that the front-face unit 120 is put into an open state.

When the portable device 10 is not attached to the front-face unit 120, opening and closing of the front-face unit 120 is not restricted. This is because there is a high possibility that a CD can be inserted to or ejected from the CD insertion/ejection slit 180 even if the portable device 10 is not attached to the front-face unit 120. However, opening and closing of the front-face unit 120 may be restricted.

Also, when the portable device 10 is detached from the front-face unit 120, the front-face unit 120 is moved to the reference position (at 0 degrees). Accordingly, when the portable device 10 is attached again to the front-face unit 120, damage to the slider 181, the gear (not shown), and the stepping motor 190 can be prevented.

In the above structure, when the portable device 10 is attached to the front-face unit 120, it is preferable that the front-face unit 120 is moved back to the position in which the front-face unit 120 is previously located before the portable device 10 is detached from the front-face unit 120.

Further, if a mechanism for locking the slider 181 when the portable device 10 is detached from the front-face unit 120 is added to the above structure, excess load is not put on the gear (not shown), the stepping motor 190, and the likes when the portable device 10 is attached again to the front-face unit 120. Accordingly, damage to the gear (not shown), the stepping motor 190 and the likes can be prevented.

As described above, in accordance with the first embodiment, when attachment of the portable device 10 to the front-face unit 120 is detected ("YES" in step S101), the controller 140 drives the front-face unit 120 in accordance with the operating mode of the tilt/eject button 132a (steps S106, S110, and S113). When detachment of the portable device 10 from the front-face unit 120 is detected ("NO" in step S101), the controller 140 receives only an operation of the tilt/eject button 132a in the first operating mode, and then drives the front-face unit 120 (steps S119 and S122).

An operation of the tilt/eject button 132a in the second mode is received only when the portable device 10 is attached to the front-face unit 120, because the visibility of the display unit 11 of the portable device 10 is increased, and the frequency of adjustment of the tilt angle of the front-face unit 120 while the portable device 10 is attached to the front-face unit 120 is higher than in the case where the portable device 10 is not attached to the front-face unit 120.

Thus, the tilting action of the front-face unit 120 can be restricted in accordance with whether the portable device 10 is attached to the front-face unit 120.

Particularly, when attachment of the portable device 10 to the front-face unit 120 is detected ("YES" in step S101), the front-face unit 120 tilts in accordance with the angle corresponding to the number of times the tilt/eject button 132a is pressed. Accordingly, the tilt angle of the front-face unit 120 can be adjusted, and the visibility of the portable device 10 can be made higher.

When detachment of the portable device 10 from the front-face unit 120 is detected ("NO" in step S101), the front-face unit 120 is put into an open state or a closed state in accordance with the pressing of the tilt/eject button 132a in the first embodiment ("NO" in step S115). Accordingly, when the front-face unit 120 is in an open state, a recording medium such as a CD can be inserted to or ejected from the device.

Also, when the portable device 10 is detached from the front-face unit 120, an operation of the tilt/eject button 132a in the second mode is not received. Accordingly, when the portable device 10 is attached again to the front-face unit 120, there is no need to adjust the tilt angle of the front-face unit 120.

Further, the memory 137 stores the table information that defines the number of times the tilt/eject button 132a is pressed in the second mode and the tilt angle θ according to the number of times, and the table information that defines the tilt angles θ corresponding to open and closed states and is to be updated. When attachment of the portable device 10 to the front-face unit 120 is detected ("YES" in step S101), the controller 140 controls the stepping motor 190 so that the front-face unit 120 tilts at the tilt angle θ that is determined based on the table information stored in the memory 137 and the number of times the tilt/eject button 132a is pressed in the first or second mode (steps S106, S110, and S113). When detachment of the portable device 10 from the front-face unit 120 is detected ("NO" in step S101), the controller 140 controls the stepping motor 190 so that the front-face unit 120 tilts at the tilt angle that is determined based on the table information and the open/closed state recorded and updated in the memory 137 (steps S119 and S122). Thus, the front-face unit 120 can tilt to an accurate position in accordance with the table information.

Next, a second embodiment of the present invention is described.

The second embodiment differs from the first embodiment only in a part of the information stored in the memory 137 and the operations to be performed by the controller 140. Therefore, only the different information stored in the memory 137 and the operations to be performed by the controller 140 are described in the following, and explanation of the other aspects of the second embodiment is omitted.

FIG. 14 shows an example of table information that is stored in the memory 137 of the vehicle-mounted device. The table information shown in FIG. 14 differs from the table information of the first embodiment shown in FIG. 12D, in that the tilt angle $\theta_1$ or $\theta_2$ in accordance with the connecting state of the portable device 10 (the tilt angle of the front-face unit 120 adjusted by pressing the tilt/eject button 132a in the second mode) is updated and recorded in the table information shown in FIG. 14, while the tilt angle of the front-face unit 120 adjusted by pressing the tilt/eject button 132a in the second mode when the portable device 10 is attached to the front-face unit 120 is updated and recorded as the current tilt angle θ in the table information shown in FIG. 12D.

As in the first embodiment, the table information shown in FIGS. 12A and 12B is stored in the memory 137. Also, as in the first embodiment, the information shown in FIG. 14 may not be stored in the memory 137, but may be stored in a memory provided inside the controller 140.

Figure 15A:
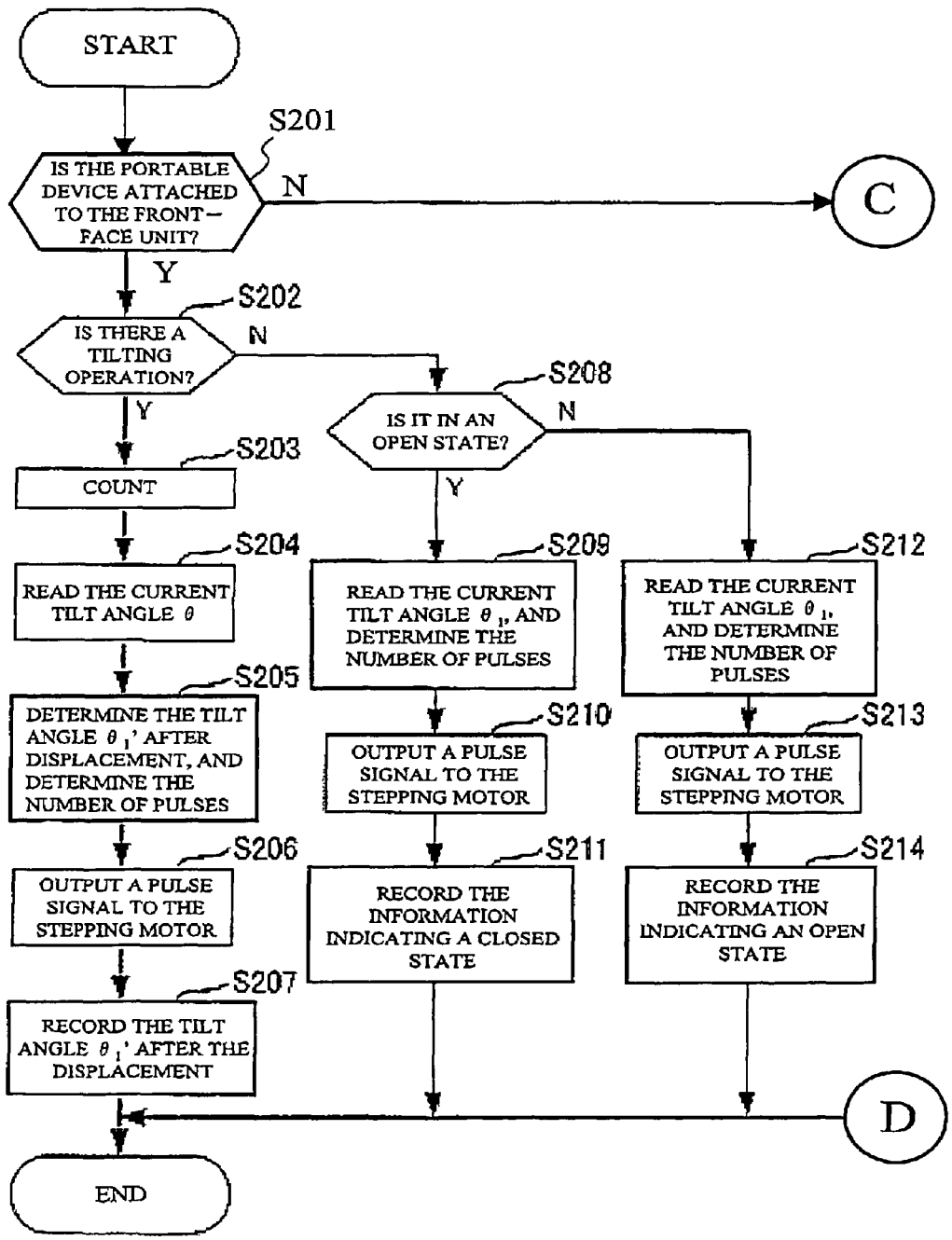
FIGS. 15A and 15B are flowcharts showing a controlling operation to be performed by the controller of the vehicle-mounted device when the tilt/eject button is handed.
Figure 15B:
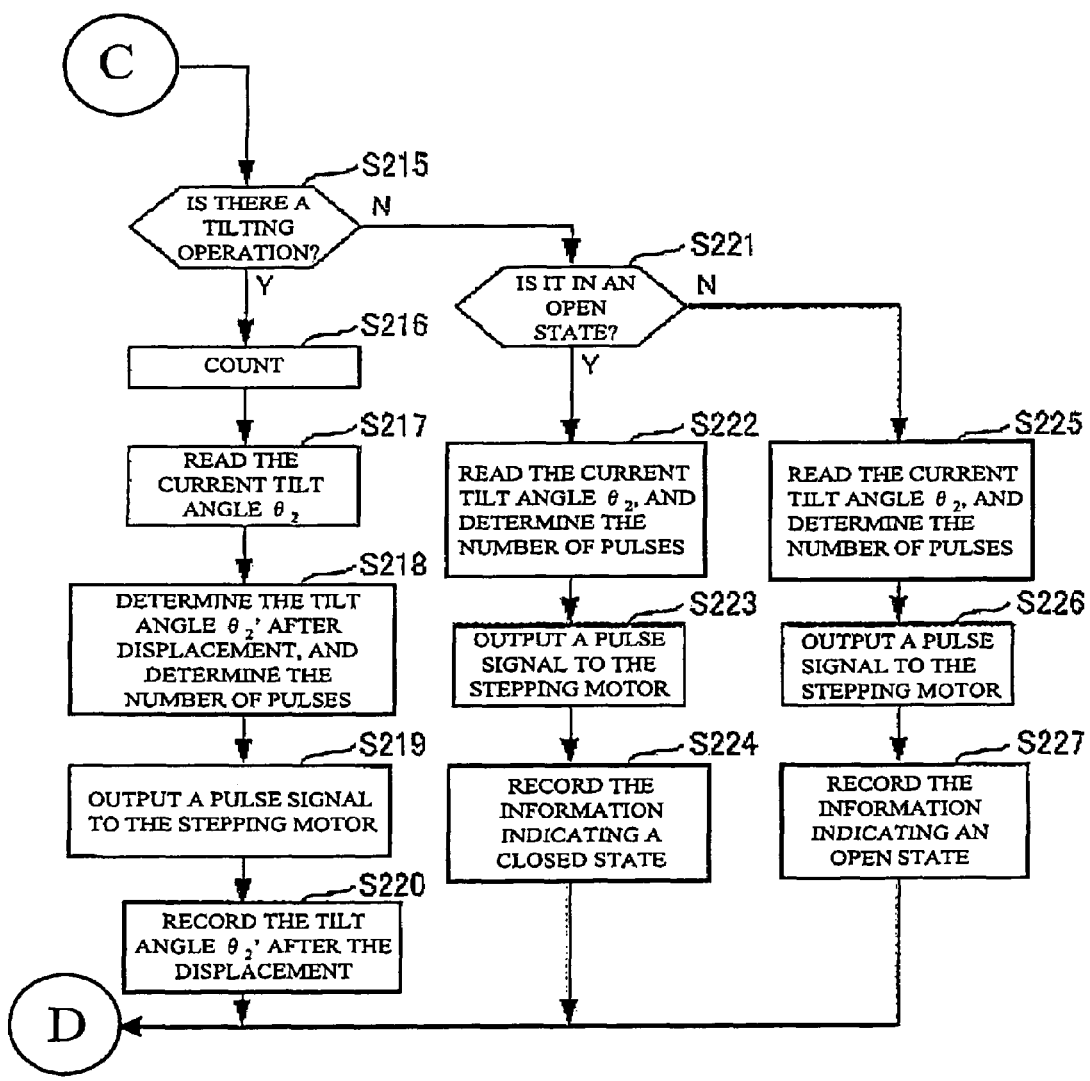
Figure 16:
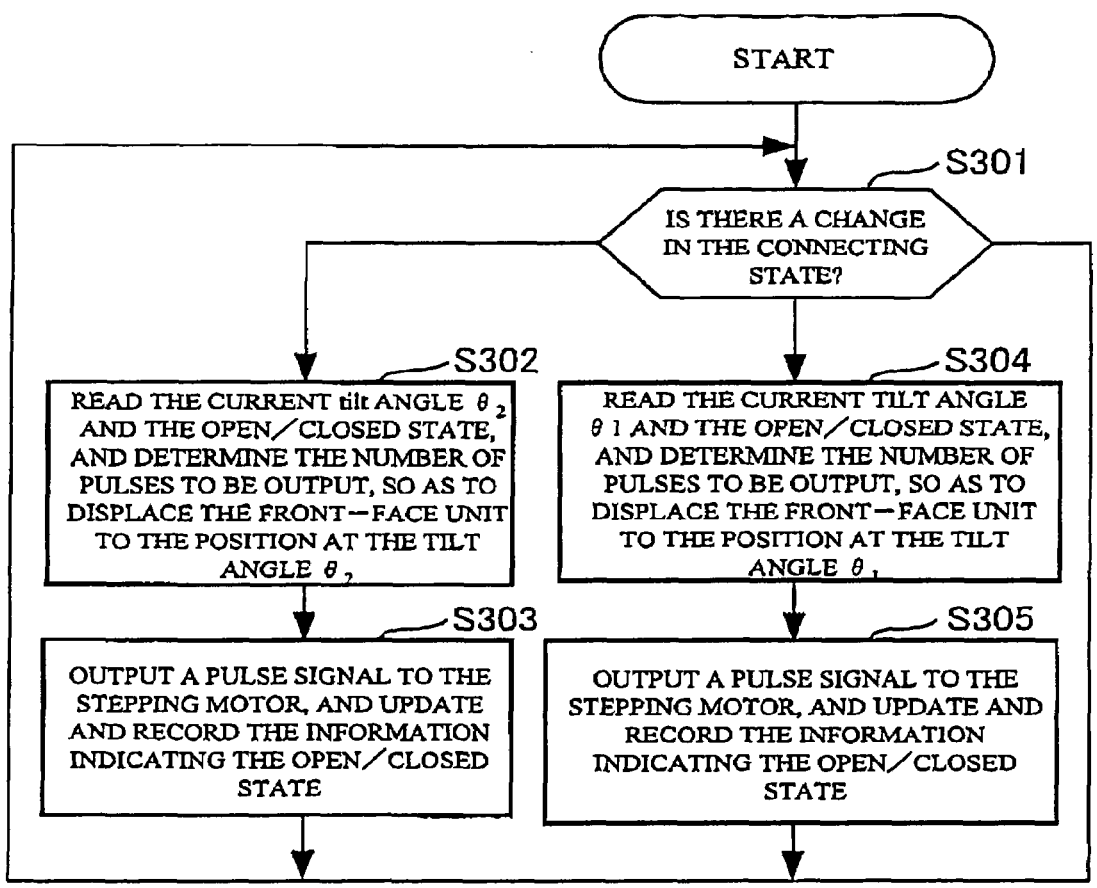
FIG. 16 is a flowchart showing a controlling operation to be performed by the controller of the vehicle-mounted device when there is a change in the connecting state of the portable device to the vehicle-mounted device.
Figure 17:
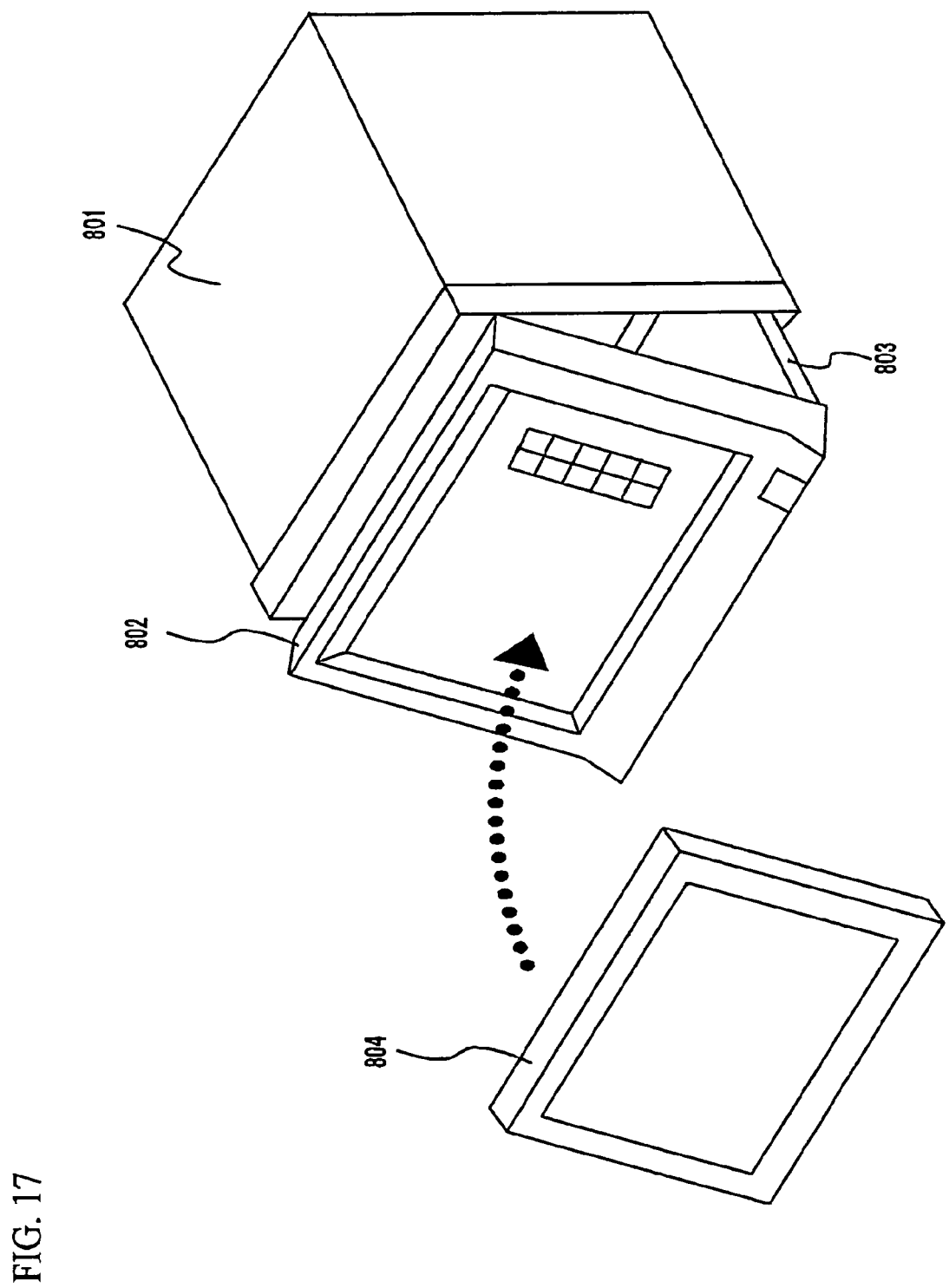
FIG. 17 is an external view of a conventional vehicle-mounted system.

FIGS. 15A and 15B are flowcharts showing a controlling operation to be performed by the controller 140 of the vehicle-mounted device 100 of the second embodiment when the tilt/eject button 132a is pressed. FIG. 16 is a flowchart showing a controlling operation to be performed by the controller 140 of the vehicle-mounted device 100 of the second embodiment when the connecting state of the portable device 10 with respect to the vehicle-mounted device 100 is changed.

As described above (as shown in FIG. 14), the memory 137 stores the current tilt angle $\theta_1$ that is the tilt angle of the front-face unit 120 adjusted by pressing the tilt/eject button 132a in the second mode while the portable device 10 is attached to the front-face unit 120, and the current tilt angle $\theta_2$ that is the tilt angle of the front-face unit 120 adjusted by pressing the tilt/eject button 132a in the second mode while the portable device 10 is detached from the front-face unit 120. The memory 137 also stores the open and closed states of the front-face unit 120 displaced by pressing the tilt/eject button 132a in the first mode.

This controlling operation shown in FIGS. 15A and 15B is started when the controller 140 detects a user pressing the tilt/eject button 132a.

First, the controller 140 determines whether the portable device 10 is attached to the front-face unit 120 of the vehicle-mounted device 100 (step S201). More specifically, the controller 140 transmits a connection signal to the controller 20 at regular intervals or in desired timing. If the controller 140 receives a response from the controller 20, the controller 140 determines that the portable device 10 is attached to the front-face unit 120 of the vehicle-mounted device 100. Alternatively, a change in the connecting state may be detected by checking the operating state of the detachment button 160, or a structure for detecting a change in the connecting state may be specially provided. Other methods and techniques may also be utilized to detect a change in the connecting state.

If the controller 140 determines in step S201 that the portable device 10 is attached to the front-face unit 120 of the vehicle-mounted device 100, the controller 140 determines whether the operating mode of the tilt/eject button 132a is the second mode (a tilt instruction) or the first mode (an open/close instruction) (step S202).

If the controller 140 determines in step S202 that the pressing of the tilt/eject button 132a by a user is to issue a tilt instruction (the second mode: long pressing (for 1.7 seconds or longer, for example)), the controller 140 counts the number of times the tilt/eject button 132a is pressed in the second mode (the tilt instruction) (step S203). The controller 140 then reads the current tilt angle $\theta_1$ from the memory 137 (the table information shown in FIG. 14) (step S204).

As described above, the memory 137 stores the current tilt angle $\theta_1$ of the front-face unit 120 displaced by pressing the tilt/eject button 132a in the second mode (a tilt instruction), as shown in FIG. 14.

Instead of the current tilt angle $\theta_1$, the information about the current tilt angle $\theta_1$ may be stored in the memory 137.

Based on the current tilt angle $\theta_1$ read from the memory 137 in step S204, the number of pressing times of the tilt/eject button 132a counted in step S203, and the table information shown in FIG. 12A and stored in the memory 137, the controller 140 determines the tilt angle $\theta_1'$ of the post-displacement, and also determines the number of pulses to be output to the stepping motor 190 in accordance with the current tilt angle $\theta_1$ and the tilt angle $\theta_1'$ of the post-displacement (step S205).

To cause the front-face unit 120 to tilt at the tilt angle $\theta_1'$ of the post-displacement, the controller 140 outputs a pulse signal having the pulses determined in step S205 to the stepping motor 190 (step S206). The stepping motor 190 then drives the slider 181 by an amount equivalent to the number of pulses in the pulse signal supplied from the controller 140.

Accordingly, the front-face unit 120 is displaced at the predetermined tilt angle $\theta_1'$. The controller 140 updates and stores the tilt angle $\theta_1'$ as the current tilt angle $\theta_1$ in the memory 137 (the table information shown in FIG. 14) (step S207), and ends this operation.

As described above, in a case where the portable device 10 is attached to the front-face unit 120, the front-face unit 120 can be displaced (can tilt) with respect to the vehicle-mounted device main unit 110, based on the number of times the tilt/eject button 132a is pressed for a tilt instruction (the second mode) and the table information shown in FIG. 12A.

If the controller 140 determines in step S202 that the pressing of the tilt/eject button 132a by the user is in the first mode (an open/close instruction: short pressing (for less than 1.7 seconds, for example)), the controller 140 determines whether the front-face unit 120 is in an open state, based on the information stored in the memory 137 (the table information shown in FIG. 14) (step S208).

As shown in FIG. 14, the memory 137 stores the information indicating that the front-face unit 120 is in an open state or a closed state, and also stores the initial value (the information indicating a closed state if an eject instruction through the tilt/eject button 132a has not been made in the past).

If the controller 140 determines in step S208 that the front-face unit 120 is in an open state, the pressing is to issue an instruction to displace the front-face unit 120 from an open state to a closed state. Therefore, the controller 140 reads the current tilt angle $\theta_1$ (the tilt angle observed before the front-face unit 120 is put into the open state) from the memory 137 (the table information shown in FIG. 14), and determines the number of pulses to be output to the stepping motor 190 so as to put the front-face unit 120 back into the state observed before the front-face unit 120 is put into the open state (at the current tilt angle $\theta_1$), based on the read current tilt angle $\theta_1$ and the table information stored in the memory 137 and shown in FIGS. 12A and 12B (step S209).

To cause the front-face unit 120 to tilt at the current tilt angle $\theta_1$ (the tilt angle observed before the front-face unit 120 is put into the open state), the controller 140 outputs a pulse signal having the pulses determined in step S209 to the stepping motor 190 (step S210). The stepping motor 190 then drives the slider 181 by an amount equivalent to the number of pulses in the pulse signal supplied from the controller 140. Accordingly, the front-face unit 120 is displaced at the current tilt angle $\theta_1$ (the tilt angle observed before the front-face unit 120 is put into the open state). The controller 140 then updates and stores the information indicating that the front-face unit 120 is in a closed state in the memory 137 (the table information shown in FIG. 14) (step S211), and ends this operation.

If the controller 140 determines in step S208 that the front-face unit 120 is not in an open state, the pressing is to issue an instruction to displace the front-face unit 120 from a closed state to an open state. Therefore, the controller 140 reads the current tilt angle $\theta_1$ from the memory 137 (the table information shown in FIG. 14), and determines the number of pulses to be output to the stepping motor 190 so as to put the front-face unit 120 into an open state, based on the read current tilt angle $\theta_1$ and the table information stored in the memory 137 and shown in FIGS. 12A and 12B (step S212).

To put the front-face unit 120 into an open state, the controller 140 outputs a pulse signal having the pulses determined in step S212 to the stepping motor 190 (step S213). The stepping motor 190 then drives the slider 181 by an amount equivalent to the number of pulses in the pulse signal supplied from the controller 140. Accordingly, the front-face unit 120 is displaced into an open state. The controller 140 then updates and stores the information indicating that the front-face unit 120 is in an open state in the memory 137 (the table information shown in FIG. 14) (step S214), and ends this operation.

As described above, in a case where the portable device 10 is attached to the front-face unit 120, the front-face unit 120 can be displaced (can tilt) with respect to the vehicle-mounted device main unit 110, based on the number of times the tilt/eject button 132a is pressed for an open/close instruction (the first mode) and the table information shown in FIGS. 12A and 12B.

The table information shown in FIG. 12B may not be stored in the memory 137, but a detecting unit (such as a limit switch) for detecting such a state (an open state) as to expose the CD insertion/ejection slit 180 based on the amount of movement of the slider 181 or the like may be provided instead. In such a case, the detection results of the detecting unit may be stored in the memory 137, instead of the information indicating whether the front-face unit 120 is in an open state or a closed state as shown in FIG. 14, and the open/closed state of the front-face unit 120 may be determined from the detection results.

In such a case, when an open instruction is issued from a user, the output of a pulse signal to the stepping motor 190 is continued until the detecting unit determines that the front-face unit 120 is put into an open state.

Meanwhile, if the controller 140 determines in step S201 that the portable device 10 is not attached to the front-face unit 120 of the vehicle-mounted device 100, the controller 140 determines whether the operating mode of the tilt/eject button 132a is the second mode (a tilt instruction) or the first mode (an open/close instruction) (step S215).

If the controller 140 determines in step S215 that the pressing of the tilt/eject button 132a by the user is to issue a tilt instruction (the second mode: long pressing (for 1.7 seconds or longer, for example)), the controller 140 counts the number of times the tilt/eject button 132a is pressed in the second mode (the tilt instruction) (step S216). The controller 140 then reads the current tilt angle $\theta_2$ from the memory 137 (the table information shown in FIG. 14) (step S217).

As described above, the memory 137 stores the current tilt angle $\theta_2$ of the front-face unit 120 displaced by pressing the tilt/eject button 132a in the second mode (a tilt instruction), as shown in FIG. 14.

Instead of the current tilt angle $\theta_2$, the information about the current tilt angle $\theta_2$ may be stored in the memory 137.

Based on the current tilt angle $\theta_2$ read from the memory 137 in step S217, the number of pressing times of the tilt/eject button 132a counted in step S216, and the table information shown in FIG. 12A and stored in the memory 137, the controller 140 determines the tilt angle $\theta_2'$ of the post-displacement, and also determines the number of pulses to be output to the stepping motor 190 in accordance with the current tilt angle $\theta_2$ and the tilt angle $\theta_2'$ of the post-displacement (step S218).

To cause the front-face unit 120 to tilt at the tilt angle $\theta_2'$ of the post-displacement, the controller 140 outputs a pulse signal having the pulses determined in step S218 to the stepping motor 190 (step S219). The stepping motor 190 then drives the slider 181 by an amount equivalent to the number of pulses in the pulse signal supplied from the controller 140. Accordingly, the front-face unit 120 is displaced at the predetermined tilt angle $\theta_2'$. The controller 140 updates and stores the tilt angle $\theta_2'$ as the current tilt angle $\theta_2$ in the memory 137 (the table information shown in FIG. 14) (step S220), and ends this operation.

As described above, in a case where the portable device 10 is attached to the front-face unit 120, the front-face unit 120 can be displaced (can tilt) with respect to the vehicle-mounted device main unit 110, based on the number of times the tilt/eject button 132a is pressed for a tilt instruction (the second mode) and the table information shown in FIG. 12A.

If the controller 140 determines in step S215 that the pressing of the tilt/eject button 132a by the user is in the first mode (an open/close instruction: short pressing (for less than 1.7 seconds, for example)), the controller 140 determines whether the front-face unit 120 is in an open state, based on the information stored in the memory 137 (the table information shown in FIG. 14) (step S221).

As shown in FIG. 14, the memory 137 stores the information indicating that the front-face unit 120 is in an open state or a closed state, and also stores the initial value (the information indicating a closed state if an eject instruction through the tilt/eject button 132a has not been made in the past).

If the controller 140 determines in step S221 that the front-face unit 120 is in an open state, the pressing is to issue an instruction to displace the front-face unit 120 from an open state to a closed state. Therefore, the controller 140 reads the current tilt angle $\theta_2$ (the tilt angle observed before the front-face unit 120 is put into the open state) from the memory 137 (the table information shown in FIG. 14), and determines the number of pulses to be output to the stepping motor 190 so as to put the front-face unit 120 back into the state observed before the front-face unit 120 is put into the open state (at the current tilt angle $\theta_2$), based on the read current tilt angle $\theta_2$ and the table information stored in the memory 137 and shown in FIGS. 12A and 12B (step S222).

To cause the front-face unit 120 to tilt at the current tilt angle $\theta_2$ (the tilt angle observed before the front-face unit 120 is put into the open state), the controller 140 outputs a pulse signal having the pulses determined in step S222 to the stepping motor 190 (step S223). The stepping motor 190 then drives the slider 181 by an amount equivalent to the number of pulses in the pulse signal supplied from the controller 140. Accordingly, the front-face unit 120 is displaced at the current tilt angle $\theta_2$ (the tilt angle observed before the front-face unit 120 is put into the open state). The controller 140 then updates and stores the information indicating that the front-face unit 120 is in a closed state in the memory 137 (the table information shown in FIG. 14) (step S224), and ends this operation.

If the controller 140 determines in step S221 that the front-face unit 120 is not in an open state, the pressing is to issue an instruction to displace the front-face unit 120 from a closed state to an open state. Therefore, the controller 140 reads the current tilt angle $\theta_2$ from the memory 137 (the table information shown in FIG. 14), and determines the number of pulses to be output to the stepping motor 190 so as to put the front-face unit 120 into an open state, based on the read current tilt angle $\theta_2$ and the table information stored in the memory 137 and shown in FIGS. 12A and 12B (step S225).

To put the front-face unit 120 into an open state, the controller 140 outputs a pulse signal having the pulses determined in step S225 to the stepping motor 190 (step S226). The stepping motor 190 then drives the slider 181 by an amount equivalent to the number of pulses in the pulse signal supplied from the controller 140. Accordingly, the front-face unit 120 is displaced into an open state. The controller 140 then updates and stores the information indicating that the front-face unit 120 is in an open state in the memory 137 (the table information shown in FIG. 14) (step S227), and ends this operation.

As described above, in a case where the portable device 10 is attached to the front-face unit 120, the front-face unit 120 can be displaced (can tilt) with respect to the vehicle-mounted device main unit 110, based on the number of times the tilt/eject button 132a is pressed for an open/close instruction (the first mode) and the table information shown in FIGS. 12A and 12B.

The table information shown in FIG. 12B may not be stored in the memory 137, but a detecting unit (such as a limit switch) for detecting such a state (an open state) as to expose the CD insertion/ejection slit 180 based on the amount of movement of the slider 181 or the like may be provided instead. In such a case, the detection results of the detecting unit may be stored in the memory 137, instead of the information indicating whether the front-face unit 120 is in an open state or a closed state as shown in FIG. 14, and the open/closed state of the front-face unit 120 may be determined from the detection results.

In such a case, when an open instruction is issued from a user, the output of a pulse signal to the stepping motor 190 is continued until the detecting unit determines that the front-face unit 120 is put into an open state.

Referring now to FIG. 16, the controlling operation to be performed by the controller 140 when the connecting state of the portable device 10 with respect to the vehicle-mounted device 100 is changed is described. This controlling operation is started when the controller 140 determines that the power source of the vehicle-mounted device is switched on, and is continued while the power source of the vehicle-mounted device 100 is in an ON state.

First, the controller 140 determines whether there is a change in the connecting state of the portable device 10 to the vehicle-mounted device 100 (step S301). A change in the connecting state is detected in the following manner. The controller 140 transmits a connection signal to the controller 20 at regular intervals or in desired timing. If the controller 140 does not receive a response from the controller 20 to the latest transmission though there has been a response from the controller 20 to the previous transmission, the controller 140 determines that the portable device 10 is detached from the vehicle-mounted device 100 (attachment to detachment). If the controller 140 receives a response from the controller 20 to the latest transmission though there has not been a response from the controller 20 to the previous transmission, the controller 140 determines that the portable device 10 is attached to the vehicle-mounted device 100 (detachment to attachment).

Alternatively, a change in the connecting state may be detected by checking the operating state of the detachment button 160, or a structure for detecting a change in the connecting state may be specially provided. Other methods and techniques may also be utilized to detect a change in the connecting state.

If the controller 140 determines in step S301 that there is not a change in the connecting state of the portable device 10 to the vehicle-mounted device 100, the controller 140 repeats the procedure of step S301.

If the controller 140 determines in step S301 that the portable device 10 is detached from the vehicle-mounted device 100 (attachment to detachment), the controller 140 reads the current tilt angle $\theta_2$ and the open/closed state of the front-face unit 120 from the memory 137 (the table information shown in FIG. 14). Here, the current tilt angle $\theta_2$ is the tilt angle of the front-face unit 120 adjusted by pressing the tilt/eject button 132a in the second mode while the portable device 10 is detached from the front-face unit 120. Based on the read current tilt angle $\theta_2$ and open/closed state and the table information stored in the memory 137 and shown in FIGS. 12A and 12B, the controller 140 determines the number of pulses to be output to the stepping motor 190 so as to displace the front-face unit 120 at the current tilt angle $\theta_2$, which is the tilt angle of the front-face unit 120 adjusted by pressing the tilt/eject button 132*a* in the second mode before the portable device 10 is attached to the front-face unit 120 (step S302).

More specifically, if the front-face unit 120 is in an open state, the controller 140 determines the number of pulses to be output to the stepping motor 190 so as to displace the front-face unit 120 to the position at the current tilt angle $\theta_2$, based on the table information shown in FIGS. 12A and 12B. If the front-face unit 120 is in a closed state, the controller 140 determines the number of pulses to be output to the stepping motor 190 so as to displace the front-face unit 120 to the position at the current tilt angle $\theta_2$, based on the table information shown in FIG. 12A.

As described above, the memory 137 stores the current tilt angle $\theta_2$ of the front-face unit 120 that is displaced by pressing the tilt/eject button 132*a* in the second mode (a tilt instruction) while the portable device 10 is detached, as shown in FIG. 14.

Instead of the current tilt angle $\theta_2$, the information about the current tilt angle $\theta_2$ may be stored in the memory 137.

To displace the front-face unit 120 to the position at the current tilt angle $\theta_2$, the controller 140 outputs a pulse signal having the pulses determined in step S302 to the stepping motor 190, and updates and stores the information indicating that the front-face unit 120 is in a closed state in the table information shown in FIG. 14 (step S303). The stepping motor 190 then drives the slider 181 by an amount equivalent to the number of pulses in the pulse signal supplied from the controller 140. Accordingly, the front-face unit 120 is displaced to the position at the current tilt angle $\theta_2$.

If the controller 140 determines in step S301 that the portable device 10 is attached to the vehicle-mounted device 100 (detachment to attachment), the controller 140 reads the current tilt angle $\theta_1$ and the open/closed state of the front-face unit 120 from the memory 137 (the table information shown in FIG. 14). Here, the current tilt angle $\theta_1$ is the tilt angle of the front-face unit 120 adjusted by pressing the tilt/eject button 132*a* in the second mode while the portable device 10 is attached to the front-face unit 120. Based on the read current tilt angle $\theta_1$ and open/closed state and the table information stored in the memory 137 and shown in FIGS. 12A and 12B, the controller 140 determines the number of pulses to be output to the stepping motor 190 so as to displace the front-face unit 120 the position at the current tilt angle $\theta_1$, which is the tilt angle of the front-face unit 120 adjusted by pressing the tilt/eject button 132*a* in the second mode before the portable device 10 is attached to the front-face unit 120 (step S304).

More specifically, if the front-face unit 120 is in an open state, the controller 140 determines the number of pulses to be output to the stepping motor 190 so as to displace the front-face unit 120 to the position at the current tilt angle $\theta_1$, based on the table information shown in FIGS. 12A and 12B. If the front-face unit 120 is in a closed state, the controller 140 determines the number of pulses to be output to the stepping motor 190 so as to displace the front-face unit 120 to the position at the current tilt angle $\theta_1$, based on the table information shown in FIG. 12A.

As described above, the memory 137 stores the current tilt angle $\theta_1$ of the front-face unit 120 that is displaced by pressing the tilt/eject button 132*a* in the second mode (a tilt instruction) while the portable device 10 is attached to the front-face unit 120, as shown in FIG. 14.

Instead of the current tilt angle $\theta_1$, the information about the current tilt angle $\theta_1$ may be stored in the memory 137.

To displace the front-face unit 120 to the position at the current tilt angle $\theta_1$, the controller 140 outputs a pulse signal having the pulses determined in step S304 to the stepping motor 190, and updates and stores the information indicating that the front-face unit 120 is in an open state in the table information shown in FIG. 14 (step S305). The stepping motor 190 then drives the slider 181 by an amount equivalent to the number of pulses in the pulse signal supplied from the controller 140. Accordingly, the front-face unit 120 is displaced to the position at the current tilt angle $\theta_1$.

To sum up, when the portable device 10 is detached from the front-face unit 120, the front-face unit 120 displaces to the position at the tilt angle observed before the portable device 10 is attached to the front-face unit 120. When the portable device 10 is attached to the front-face unit 120, the front-face unit 120 returns to the state observed before the portable device 10 is detached from the front-face unit 120.

As described above in detail, in accordance with the second embodiment, when the portable device 10 is detached from the vehicle-mounted device 100, the front-face unit 120 is displaced to the position at the tilt angle that is obtained by pressing the tilt/eject button 132*a* in the second mode before the portable device 10 is attached to the vehicle-mounted device 100. When the portable device 10 is attached to the vehicle-mounted device 100, the front-face unit 120 is displaced to the position at the tilt angle that is obtained by pressing the tilt/eject button 132*a* in the second mode before the portable device 10 is detached to the vehicle-mounted device 100. Accordingly, there is no need to adjust the tilt angle of the front-face unit 120 after the portable device 10 is detached from or attached to the vehicle-mounted device 100.

Also, in accordance with the second embodiment, when the slider 181 slides in the vehicle-mounted device main unit 110, the controller 140 stores the tilt angle ($\theta_1$, $\theta_2$) of the front-face unit 120 in the memory 137, so that the controller 140 can read the tilt angle ($\theta_1$, $\theta_2$) of the front-face unit 120 from the memory 137, and output a pulse signal suitable for the read tilt angle to the stepping motor 190. Thus, the amount of sliding movement of the slider 181 can be accurately stored as the tilt angle, and the slider 181 can be moved with high precision.

Instead of the tilt angle of the front-face unit 120, the number of pulses in the pulse signal that is output to the stepping motor 190 may be stored in the memory 137, so as to accurately store the amount of sliding movement of the slider 181 as the number of pulses. Thus, the slider 181 can be moved with high precision.

The above described embodiments are merely examples of preferred embodiments of the present invention. However, the present invention is not limited to them, and various changes and modifications may be made to them without departing from the principles and spirit of the invention.

Although vehicle-mounted devices have been described in the above embodiments, the present invention is not limited to vehicle-mounted devices, but may be applied to electronic devices that serve as home electric appliances.

Also, the front-face unit 120 tilts in the above described embodiments. However, the upper face portion provided on the upper face of an electronic device may be designed to stand vertically on the electronic device.

Although the portable device 10 is a portable navigator in the above described embodiments, the present invention is not limited to that, and the portable device 10 may be a portable device such as a portable telephone device with navigating functions or a portable digital assistant (PDA) with navigating functions.

Further, instead of the CD insertion/ejection slit and the CD reproducing unit, it is possible to employ an insertion/ejection slit and a reproducing unit for other recording media such as MDs, DVDs, and SD cards. It is also possible to employ two or more insertion/ejection slits and two or more reproducing units for two or more kinds of recording media.

Further, in the above described embodiment, tilting and opening/closing of the front-face unit 120 are controlled by handling only one button. However, it is possible to provide a button for a tilt instruction and a button for an open/close instruction, independently of each other.

The present application is based on Japanese Patent Application No. 2007-018591 filed Jan. 29, 2007, the entire disclosure of which is hereby incorporated by reference.

What is claimed is:

1. An electronic device comprising:
a main unit;
a cap unit that is capable of having a portable electronic device attached thereto;
an instructing unit that issues an instruction to designate a tilt angle of the cap unit with respect to the main unit;
a driving unit that drives the cap unit in accordance with the instruction from the instructing unit; and
a controlling unit that controls display or a speaker to output an alarm or an instruction, when the portable electronic device is not attached to the cap unit, and when an instruction to adjust the tilt angle of the cap unit with respect to the main unit is issued.

2. The electronic device as claimed in claim 1, wherein:
the instructing unit comprises:
a first instructing unit that issues the instruction to adjust the tilt angle of the cap unit with respect to the main unit; and
a second instructing unit that issues an instruction to put the cap unit into an open state; and
the controlling unit controls the operation of the driving unit in accordance with the instruction from the first instructing unit.

3. The electronic device as claimed in claim 1, wherein the controlling unit controls the operation of the driving unit so that the cap unit is in an open state in accordance with the instruction from the instructing unit, when the portable electronic device is not attached to the cap unit, and the cap unit is in a closed state previously.

4. The electronic device as claimed in claim 1, wherein the controlling unit controls the operation of the driving unit so that the cap unit is in a closed state in accordance with the instruction from the instructing unit, when the portable electronic device is not attached to the cap unit, and the cap unit is in an open state previously.

5. The electronic device as claimed in claim 1, wherein the outputted alarm is an alarm to the effect that the cap unit is not capable of being displaced, and the outputted instruction is an instruction to attach the portable electronic device to the cap unit.

6. An electronic device comprising:
a main unit;
a cap unit that is capable of having a portable electronic device attached thereto;
an instructing unit that issues an instruction to designate a tilt angle of the cap unit with respect to the main unit;
a driving unit that drives the cap unit in accordance with the instruction from the instructing unit;
a memory unit that stores tilt angle information about a tilt angle of the cap unit observed before the portable electronic device is detached from the cap unit, or tilt angle information about a tilt angle of the cap unit observed before the portable electronic device is attached to the cap unit; and
a controlling unit that controls the driving unit, based on a change in a connecting state of the portable electronic device and the tilt angle information that is stored in the memory unit.

7. An electronic system comprising:
a portable electronic device; and
an electronic device that is capable of having the portable electronic device attached thereto,
the electronic device comprising:
a main unit;
a cap unit that is capable of having a portable electronic device attached thereto;
an instructing unit that issues an instruction to designate a tilt angle of the cap unit with respect to the main unit;
a driving unit that drives the cap unit in accordance with the instruction from the instructing unit; and
a controlling unit that controls a display or a speaker to output an alarm or an instruction, when the portable electronic device is not attached to the cap unit, and when an instruction to adjust the tilt angle of the cap unit with respect to the main unit is issued.

8. An electronic system comprising:
a portable electronic device; and
an electronic device that is capable of having the portable electronic device attached thereto,
the electronic device comprising:
a main unit;
a cap unit that is capable of having a portable electronic device attached thereto;
an instructing unit that issues an instruction to designate a tilt angle of the cap unit with respect to the main unit;
a driving unit that drives the cap unit in accordance with the instruction from the instructing unit;
a memory unit that stores tilt angle information about a tilt angle of the cap unit observed before the portable electronic device is detached from the cap unit, or tilt angle information about a tilt angle of the cap unit observed before the portable electronic device is attached to the cap unit; and
a controlling unit that controls the driving unit, based on a change in a connecting state of the portable electronic device and the tilt angle information that is stored in the memory unit.

* * * * *